US010547247B2

(12) United States Patent
Odložilík et al.

(10) Patent No.: US 10,547,247 B2
(45) Date of Patent: Jan. 28, 2020

(54) CONVERTER WITH OSCILLATOR AND A SYSTEM OF CONVERTER WITH OSCILLATOR COUPLED WITH A LOAD

(71) Applicant: NAMI-TECH S.R.O., Zlín (CZ)

(72) Inventors: Miroslav Odložilík, Perná (CZ);
Dalimil Zrůna, Uherský Ostroh (CZ);
Martin Zrůna, Uherský Ostroh (CZ)

(73) Assignee: NAMI-TECH S.R.O., Zlin (CZ)

( * ) Notice: Subject to any disclaimer, the term of this patent is extended or adjusted under 35 U.S.C. 154(b) by 135 days.

(21) Appl. No.: 15/534,928

(22) PCT Filed: Dec. 10, 2015

(86) PCT No.: PCT/CZ2015/000150
§ 371 (c)(1),
(2) Date: Jun. 9, 2017

(87) PCT Pub. No.: WO2016/091234
PCT Pub. Date: Jun. 16, 2016

(65) Prior Publication Data
US 2018/0269802 A1    Sep. 20, 2018

(30) Foreign Application Priority Data

Dec. 10, 2014    (CZ) .................................... 2014-885

(51) Int. Cl.
*H02M 7/06* (2006.01)
*H02M 1/12* (2006.01)
(Continued)

(52) U.S. Cl.
CPC ........... *H02M 7/066* (2013.01); *H02M 1/126* (2013.01); *H02M 1/44* (2013.01); *H02M 3/28* (2013.01); *H02M 7/064* (2013.01); *H03B 5/18* (2013.01)

(58) Field of Classification Search
CPC ........ H03B 5/18; H02M 7/066; H02M 7/064; H02M 1/126; H02M 2007/2195;
(Continued)

(56) References Cited

U.S. PATENT DOCUMENTS 9,065,321 B2 *   6/2015   Divan ..................... H02M 1/00
2003/0043607 A1   3/2003   Vinciarelli et al.

FOREIGN PATENT DOCUMENTS

GB          2137442 A       10/1984

OTHER PUBLICATIONS

International Search Report and Written Opinion in corresponding International Patent Application No. PCT/CZ2015/000150, dated May 19, 2016. 9 pages.
(Continued)

*Primary Examiner* — Arnold M Kinkead
(74) *Attorney, Agent, or Firm* — Leason Ellis LLP

(57) ABSTRACT

Converter with oscillator characterized in that it comprises an input for connecting the phase through a first node to cathode of a first diode as well as to anode of a second diode, where the first diode has anode connected through a third node to anode of a third diode as well as to a first output, wherein cathode of a third diode is connected through a fourth node to the anode of a fourth diode as well as to neutral conductor or to a second phase as well as to a second output, wherein the fourth diode has an anode connected to a third output and through a second node to the cathode of the second diode, wherein parallelly to the second node and to the third node at least one oscillator circuit comprising a bifilar coil with a first winding and a second winding and at least one capacitor is connected. Another object of the invention is a system comprising a converter with oscillator and a load as well as a three-phase system.

15 Claims, 19 Drawing Sheets

(51) Int. Cl.
*H02M 1/44* (2007.01)
*H02M 3/28* (2006.01)
*H03B 5/18* (2006.01)

(58) Field of Classification Search
CPC .......... H02M 7/219; H02M 1/44; H02M 5/00;
H02M 3/28
USPC ......... 363/65, 161, 25, 21.15, 21.18, 34, 64,
363/157, 171, 37, 26; 331/167, 117 FE
See application file for complete search history.

(56) References Cited

OTHER PUBLICATIONS

International Preliminary Report on Patentability in corresponding International Patent Application No. PCT/CZ2015/000150, completed Apr. 20, 2017. 9 pages.
Pejovic et al. "A novel harmonic-free three-phase diode bridge rectifier applying current injection." Applied Power Electronics Conference and Exposition, 1999. APEC'99. Fourteenth Annual. vol. 1. IEEE, 1999.

* cited by examiner

CONVERTER WITH OSCILLATOR AND A SYSTEM OF CONVERTER WITH OSCILLATOR COUPLED WITH A LOAD

CROSS-REFERENCE TO RELATED PATENT APPLICATIONS

This application is a U.S. National Phase Application under 35 U.S.C. § 371 of International Patent Application No. PCT/CZ2015/000150, filed Dec. 10, 2015, and claims the priority of PV 2014-885, filed Dec. 10, 2014, all of which are incorporated by reference in their entireties. The International Application was published on Jun. 16, 2016 as International Publication No. WO 2016/091234 A1.

FIELD OF THE INVENTION

The invention relates to a converter comprising LC, LC-LC or LC-CL oscillator with inductive coupling of bifilar coil connected at the middle of the Graetz bridge, which modifies the flow of voltage and current at the output and prolongs their action when the converter is coupled with a load. Further, the invention relates to a system of converter and load comprising the aforesaid converter and at least two loads.

BACKGROUND OF THE INVENTION

In electrical engineering, a converter represents a device intended for changing the parameters of electricity. The basic parameters of electricity are the size of voltage, current, as well as the frequency in alternating power supplies. Based on the physical laws, it implies that the energy conversion efficiency is always less than 100% and every converter has an energy loss. Electricity converters mostly operate with very good efficiency with losses around 5-10% around the operating point however when the device is unloaded the relative losses tend to be higher. The most commonly used converter is a transformer, a device that enables changes to the size of AC voltage. In the past, electromechanical rotary converters were used for changing the size of DC voltage, which consisted of a DV electric motor and generator arranged on a common shaft.

Today, the most common converters are semiconductor converters for changing voltage or frequency. Depending on its application the converter may be: a rectifier; an inverter, which inverts the AC into DC power frequency converter, which converts the frequency of alternating voltage and current.

Recently active rectifiers, which also allow the recovery (a reverse flow of power—and returning the energy into the AC power network) have been used.

Now semiconductor converters can be found in almost every electrical device, either switching power supplies for computers or other consumer electronics; frequency converters in compact fluorescent bulbs, rechargeable batteries, in microwave ovens or induction heating cookers. One of the most important applications of semiconductor converters are in the regulated electric drives, allowing a significant increase in efficiency, dynamics, stability, accuracy and value of the usage of the drive.

Voltage multiplier is a voltage converter consisting of diodes and capacitors, which converts AC voltage into DC voltage several times higher than its value. The circuit is connected in such way that one half cycle of alternating current charges the capacitors parallelly and the second (opposite) half cycle uncharges them in series connection. For one pair of diode and capacitor twice the input voltage is formed at the output. It is possible to repeat this basic circuit in a cascade and thus create an output with much higher voltage. The voltage multiplier has been used as a cheap and small substitute for a transformer where there is low consumption of current with high voltage. An example is an old electric insect trap, in which the mains voltage (220 V) produced several thousands of volts used for burning insects. Also some TVs use voltage multiplier as a source of preload for the screen. This circuit is also used in physics and wherever it is needed to easily produce high DC voltage, because it provides preferable spatial distribution of voltage. Ideally, at one level the voltage corresponds to a double amplitude of the source voltage, from which it is powered. A device working on this principle is called a cascade generator.

In general a circuit working on this principle is called a charge pump and is used in electronics, wherever a cheap power supply with low power is needed. For example, level converters for standard serial RS232, such as MAX232 circuit.

They had been used in receivers without transformers with mains voltage of 110 to 125 V where the AC voltage was not sufficient to reach high enough DC voltage.

Rectifier is an electric device which converts AC electrical power to DC electrical power. As the electrical circuits need DC current to function and AC current is used for distribution of electricity, the rectifier is usually a part of electrical devices and consumer electronics devices, powered from the mains supply. Rectifiers are often used in power systems of electric traction vehicles (e.g. propulsion of locomotives, trams, trolley buses or subway cars). Today semiconductor rectifiers based on silicon are almost exclusively used which have almost entirely replaced other devices. New devices based on silicone carbide may emerge with the advantage of operating at higher temperature.

A complex one-port Resonant circuit is formed by parallel or series connections of capacitor and coil. At a certain frequency, the resonant frequency, the capacitive and inductive reactance are balanced and the resonant circuit behaves like an active resistor at this frequency. The state of the circuit, which occurs at the resonant frequency, is called resonance. It is a phenomenon in which at the certain frequency the RLC circuit increases the current in a series circuit or substantially increases the voltage in a parallel circuit. Series resonant circuit has a resonant frequency at the lowest impedance. Parallel resonant circuit has a resonant frequency at the highest impedance. The circuit at this frequency has only an effective resistance.

We have two electric components which are able to gather energy:
  capacitor—gather electrostatic energy
  coil—gather magnetic energy We connect both components into an electric CL circuit, charge the capacitor and then couple it with a coil. The capacitor is short-circuited through the coil, starts to discharge, however, the current does not increase sharply (the coil induces counter-voltage), the capacitor gets discharged (its energy decreases), the increasing electric current flows through the coil and generates increasing magnetic field (and also increasing the energy comprised in the coil), the capacitor discharges (the voltage decreases to zero) and all the energy is transferred to the coil. There is no other electric charge on the capacitor plates which would incite the current however the current does not drop to zero because the coil maintains the current status (current flow) and induces current flowing in the same direction as it did at the beginning, so that the capacitor charges to the opposite polarity than at the beginning (the energy is transferred from the coil back to the capacitor). The current gradually decreases and the voltage on the capacitor increases, the capacitor is charged to the same voltage but opposite polarity (energy is transferred from the coil back to the capacitor) and this is repeated again in the opposite direction.

Bifilar coil in electrical engineering is defined as a coil made of a double conductor (a pair of concurrently winded wires). If we connect both conductors on one end, the current in the neighbouring conductors flows in the opposite direction. The resulting magnetic fields counteract each other and their effects cancel each other. Such coil is used in production of wire wound resistors with very low parasitic inductance.

When we use the both conductors as a separate transformer coils, a transformer with exceptionally low leakage inductance is obtained. Bifilar as well as multiple-winding transformers stand out with their particularly good pulse transmission characteristics. These characteristics are useful for example when operating pairs of switching transistors. Conductors of such transformer are wound parallelly and eventually mutually twisted. A drawback is, of course, the increase of capacity of such closely related coils. Bifilar coils are nowadays used as choking coils for various voltage filters and compensating members. Geometric characteristics determine the characteristics of each coil. Surface of the coil core affects the transmitted power, wire diameter and its material affects the size of resistance as well as the flowing current, and the number of turns affects the size of the output voltage.

Today various forms of electric heating are used. Direct conversion of electrical energy into heat is achieved using the resistance connected in the electric circuit. Heating elements with resistance powered by AC voltage and current are used as loads in these devices. This principle is used in thermal resistance devices, e.g. electric boilers which are usually powered from the mains with AC voltage and current with the frequency of 50 Hz. Also appearing are installations using DC voltage and current which are considered to be more effective. These are also more economical in terms of thermal resistance because the constant vibrations and temperature changes do not occur.

In installation today we have met the demand for increased heating capacity of the existing as well as newly installed and produced heating systems. In addition we have demonstrated a reduction in heating times and reaching higher temperatures for a comparative and constant input. In certain technological processes this has lead to increasing the efficiency of the production processes. In commercial and domestic properties it has lead to providing a higher thermal comfort despite the existence of insufficiently dimensioned heating through shortening the time of heating and increasing the temperature in the interior spaces whilst reducing the power consumed.

SUMMARY OF THE INVENTION

The aim of the invention is to present a converter with an oscillator which modifies the flow of voltage and current on the output of the converter and prolongs the time of their action on the connected loads.

This aim is achieved by a converter with an oscillator connected to an AC voltage supply via a first phase input terminal and a neutral conductor or a second phase input terminal which is characterized in that it comprises the first phase input terminal of the converter for connecting the phase connected through a first node to a cathode of a first diode as well as to an anode of a second diode, where the first diode has an anode connected through a third node to an anode of a third diode as well as to a first output terminal of the converter, wherein a cathode of the third diode is connected through a fourth node to an anode of a fourth diode as well as to the neutral conductor or to the second phase input terminal of the converter as well as to a second output terminal of the converter, wherein the fourth diode has a cathode connected to a third output terminal of the converter and through a second node to a cathode of the second diode, wherein between the second node and the third node one or more mutually parallelized oscillator circuits comprising a bifilar coil with a first winding and a second winding, and at least one capacitor, are connected.

The converter with the oscillator according to the invention may have three embodiments differing in the arrangement of the oscillator circuit. In the first embodiment, the oscillator circuit is connected so that first end of the first winding of the bifilar coil is connected through the first capacitor and the first end of the second winding of the bifilar coil is directly connected to the third node, while the other end of the first winding of the bifilar coil is directly connected to the second node and the other end of the second winding of the bifilar coil is connected to the second node through the second capacitor. It is an LC-CL type of embodiment.

In the second embodiment the oscillator circuit is connected so that the first ends of the first winding of the bifilar coil and of the second winding of the bifilar coil are connected directly to the third node and the other ends of the first winding of the bifilar coil and of the second winding of the bifilar coil are connected through at least one capacitor to the second node. It is an LC embodiment.

In the third embodiment the oscillator circuit is connected so that first ends of the first winding of the bifilar coil and of the second winding of the bifilar coil are directly connected to the third node and the other end of the first winding of the bifilar coil is connected through the first capacitor and the other end of the second winding of the bifilar coil is connected through the second capacitor to the second node. It is an LC-LC embodiment.

This converter is thus based on the CL, LC-LC or CL-CL oscillator with inductive coupling of the bifilar coil connected to the centre of the Graetz bridge and this modifies the flow of voltage and current as it is described below.

Embodiment variant of the oscillator circuit, where the first ends of the first winding of the bifilar coil and of the second winding of the bifilar coil connected directly to the third node and the other ends of the first winding of the bifilar coil and of the second winding of the bifilar coil connected through at least one capacitor to the second node (CL type of oscillator circuit), will be easier to produce. It also allows connection of a system of capacitors, which are arranged in series, in parallel or series-parallel, e.g. to achieve the required overall capacitance of the oscillator circuit. This connection has shown to be less powerful in practice than connection with CL-LC configuration.

The variant of the oscillator circuit embodiment, in which the first end of the first winding of the bifilar coil is connected through the first capacitor and the first end of the second winding of the bifilar coil is connected directly to the third node, while the other end of the first winding of bifilar coil is directly connected and the other end of the second winding of bifilar coil is connected through the second capacitor to the second node (CL-LC type of oscillator circuit) shows the most favourable effect on the load after being connected.

The variant of the oscillator circuit embodiment, in which one ends of the first winding of bifilar coil and of the second winding of bifilar coil are connected directly to the third node and the other end of the first winding of bifilar coil is connected through the first capacitor and the other end of the second winding of bifilar coil is connected through the second capacitor to the second node (CL-CL type of oscillator circuit) lacks the advantage of temporal distribution of the effect of mutual induction of bifilar coil and is thus less effective after being connected than the connection with CL-LC configuration.

In the preferred embodiment is the overall capacitance XC of all connected capacitors (in CL type of oscillator circuit) or capacitance of capacitors in particular branches of oscillator circuit XC1 and XC2 (CL-LC and CL-CL type of oscillator circuit) equals to the entire $\pi/2$ multiples of the XL inductance of the bifilar coil comprising the first and the second winding. In this case we achieve the most preferred flow of modified voltage and current. However, the performed measurements show that the favourable modification can be achieved even in case of deviation from the said relation, which might be caused e.g. by tolerance in the production of coils and capacitors or unavailability of coils and capacitors with the required parameters, when the favourable modification of the flow of voltage and current is achieved even under the conditions, when the overall capacitance XC of all connected capacitors (in CL type of oscillator circuit) or capacitance of capacitors in particular branches (in case of one capacitor in each branch, thus capacitance of the first capacitor and capacitance of the second capacitor) of the XC1 and XC2 oscillator circuit (in CL-LC and CL-CL type of oscillator circuit) equals to entire $\pi/2$ multiples of the XL inductance of the bifilar coil ±20%.

Another feature of the invention is that a system comprising the converter with the oscillator as described above, and a load, which is characterized in that the first load is connected to the first output terminal of the converter and to the second output terminal of the converter, and the second load is connected to the second output terminal of the converter and to the third output terminal of the converter, wherein resistance of the first load equals to the resistance of the second load ±20%. Ideally, the resistances of the loads are identical. However, they may differ in practice, due to inconsistencies and tolerances in production and similar phenomenons. The increasing difference between the loads results in decreasing effectiveness of the system of converter with oscillator connected with load. It has been experimentally proved that the variance in resistances should be in the range of ±20%. Each load may consists of several partial loads, wherein the requirements for the overall load has to be met.

Thanks to the connection, the LC-CL oscillator circuit in the middle of Graetz bridge with two identical loads connected parallelly to the third diode and the fourth diode, and utilisation of properties of the bifilar coil with inductive coupling constructed according to the defined parameters, the initial voltage and current are split into positive and negative wave (impulse). These impulses go through the circuit in different timings. In the second and the third node, i.e. in places where the oscillator circuit is connected to the Graetz bridge, the input impulses are split into two parts. The first part of the input impulse goes directly to the load. In case the impulse is positive thus from the second node to the second load, in case of negative impulse from the third node to the first load. The second part of the input impulse then continues to the oscillator circuit. Here the first, e.g. positive impulse from the direction of the second node, goes through the series-parallel oscillator circuit into the third node. In the oscillator circuit the impulse is split into two of its parallel branches. The impulse thus appears simultaneously on the first capacitor of the first branch and on the second winding of bifilar coil in the second branch, and thanks to the induction coupling of the bifilar coil also on the first winding of the bifilar coil in the first branch (at this point, without using the bifilar coil passively). The impulse further continues to the second capacitor of the second branch and simultaneously to the already active first winding of the bifilar coil in the first branch. These impulses are united behind the CL-LC circuit and the impulse continues to the fifth node, where it is split again, and the first part continues directly to the first load and the second part goes through the third diode to the second load, which is already partially saturated by the impulse coming directly from the second node. The duration of the each input impulse is defined by a $\pi$ period of the duration of the input voltage. Thanks to properly set values XL and XC the oscillator circuit operates in the preferred mode at the frequency determined by the input voltage frequency. Values of the XL inductance and XC capacitance must always be calculated according to the input voltage parameters, its frequency, and with respect to the resistance of the first and the second load, wherein ideally it applies that $XC1=XC2=XL*n*\pi/2$. The whole process in the oscillator circuit is repeated always with positive and negative impulses periodically alternating. The repeated process of impulses in the circuit results in retrieval of impulses in CL-LC circuit thanks to the correct values of component and precise timing. Further, the duration of action of voltage and current on the loads in total during the $2\pi$ period is prolonged for an entire $\pi$ to $3\pi$. It is a sum of durations during which the particular capacitors get discharged, each for $\frac{1}{4}\pi$ in CL-LC circuit, thus for two capacitors and two impulses, a positive and a negative, thus together $4\times\frac{1}{4}\pi$.

In the CL-CL connection, thus two branches of oscillator circuit with identical arrangement of capacitors and the first and the second winding of the bifilar coil, the signal is split into two parts, which flow through particular branches in the same manner as in classic CL circuit, only the impulse is affected due to the inductive coupling of bifilar coil.

The flow through the oscillator in CL connection is easier. Here the signal behaves like in series CL circuit, however, mutual influence of the impulses due to the inductive coupling of bifilar coil occurs.

In the preferred embodiment, the resistance of the first load and resistance of the second load equals to inductance of the bifilar coil. It has been experimentally proven that the acceptable deviation is around 20%. In practice it is thus preferable to choose the parameters of converter, i.e. inductance of the used bifilar coil and capacitance of used capacitors, with respect to the intended load. The resistances of common loads will typically move in the range between 12Ω to 150Ω. Functionality of the converter has been experimentally proven on heating devices with a high content of iron, e.g. kanthal.

The number of turns of the bifilar coil L in the converter with the oscillator or in the complex system of converter with oscillator and load will move in the range between 50 to 6000 turns.

In case we want to connect the load with low resistance, high current load, we use connection with the double oscillator circuit, in which two identical series-parallel oscillator circuit connected parallelly to the third and the fourth diode. In such case, for resistances of the first and second load applies a relation R1=R2=XL of the first circuit=XL of the second circuit.

In case we want to connect a three-phase device or to achieve an even load of particular phases, we connect three converters with oscillator into a cascade so that the converter 1 is connected between phases L1 and L2, converter 2 between phases L2 and L3 and converter 3 between phases L3 and L1.

The converter with the oscillator according to the invention may be powered from the 230V/50 Hz mains as well as from the 400V/50 Hz mains. Of course, it is suitable also for alternative mains, e.g. 120V/60 Hz, eventually any other. Capacitance of capacitors and inductance of the bifilar coil depend on the frequency of power supply. It is derived from known relations where Xc equals to ½π*frequency*capacitance and Xl equals to 2*π*frequency*inductivity. In practice it means that to achieve the preferred embodiment of the system of converter coupled with a load we have to take into account the frequency of the voltage of the mains, and to choose a bifilar coil with a corresponding inductance according to the given loads and known frequency as well as to choose capacitors with a corresponding capacity.

BRIEF DESCRIPTION OF THE DRAWINGS

The attached drawings serve to illustrate the summary of the invention, where

FIG. 15 illustrates a diagram of the progress of voltages measures on the input of the load connected according to the FIG. 2a.

FIG. 16 illustrates a diagram of the progress of voltages measured on the loads connected according to the FIG. 2a.

FIG. 17 illustrates a diagram of the progress of measured currents on the input and on the loads connected according to the FIG. 2a.

FIG. 18 illustrates a diagram of progress of the measured current on the loads connected according to the FIG. 2a.

FIG. 21 illustrates progress of voltage, current and resistance on the neutral conductor in the connection according to the FIG. 2a.

EXEMPLARY EMBODIMENTS

Figure 1:
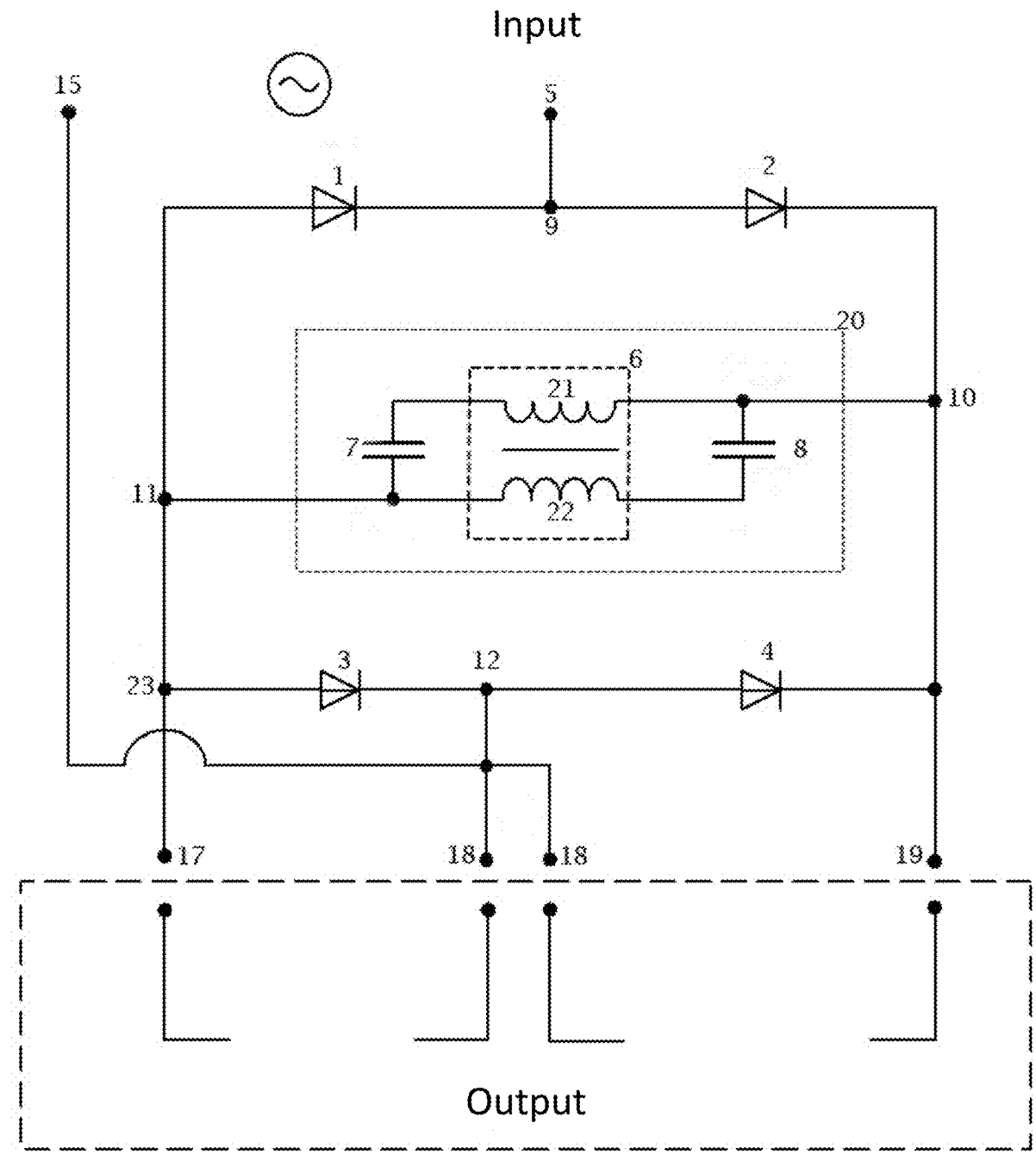
FIG. 1 illustrates a scheme of one-phase connection of converter and CL-LC oscillator according to the invention.

The scheme of connection of the converter with the CL-LC type of an oscillator in an exemplary embodiment is illustrated in the FIG. 1a. At the first phase input terminal 5 of the converter the phases of converter with oscillator are parallelly connected through the first node 9 to the cathode of the first diode 1 as well as to the anode of the second diode 2, where the first diode 1 has the anode connected through the third node 11 to the anode of the third diode 3 as well as to the first output terminal 17 of the converter, wherein the cathode of the third diode 3 is connected through the fourth node 12 to the anode of the fourth diode 4 as well as to the neutral conductor 15 (FIG. 1a) or to the second phase input terminal 16 (not shown) of the converter and also to the second output terminal 18 of the converter, wherein the fourth diode 4 has the cathode connected to the third output terminal 19 of the converter as well as to the cathode of the second diode 2 via the second node 10, which results in a standard Graetz bridge connection. Between the second node 10 and the third node 11, one oscillator circuit 20 is connected, which further comprises the bifilar coil 6 with the first winding 21 and the second winding 22 and two capacitors. Oscillator circuit 20 is connected so that the first end of the first winding 21 of the bifilar coil 6 is connected via the first capacitor 7 and the first end of the second winding 22 of bifilar coil 6 is directly connected to the third node 11, while the other end of the first winding 21 of the bifilar coil 6 is directly connected and the other end of the second winding 22 of the bifilar coil 6 is connected via the second capacitor 8 to the second node 10.

Figure 2A:
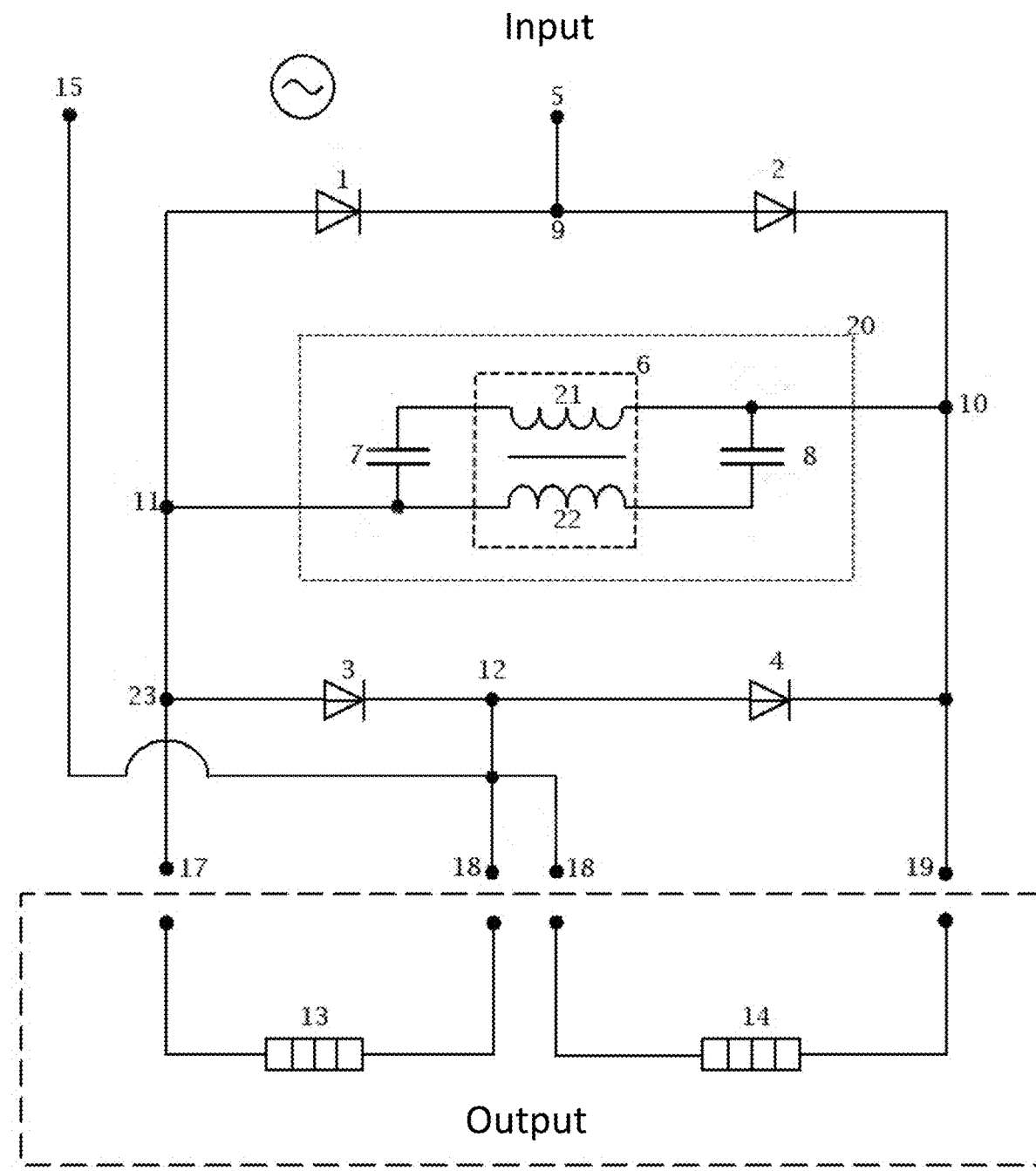
FIG. 2a illustrates a scheme of one-phase connection of a system of converter and CL-LC oscillator connected with a load according to the invention.
Figure 2B:
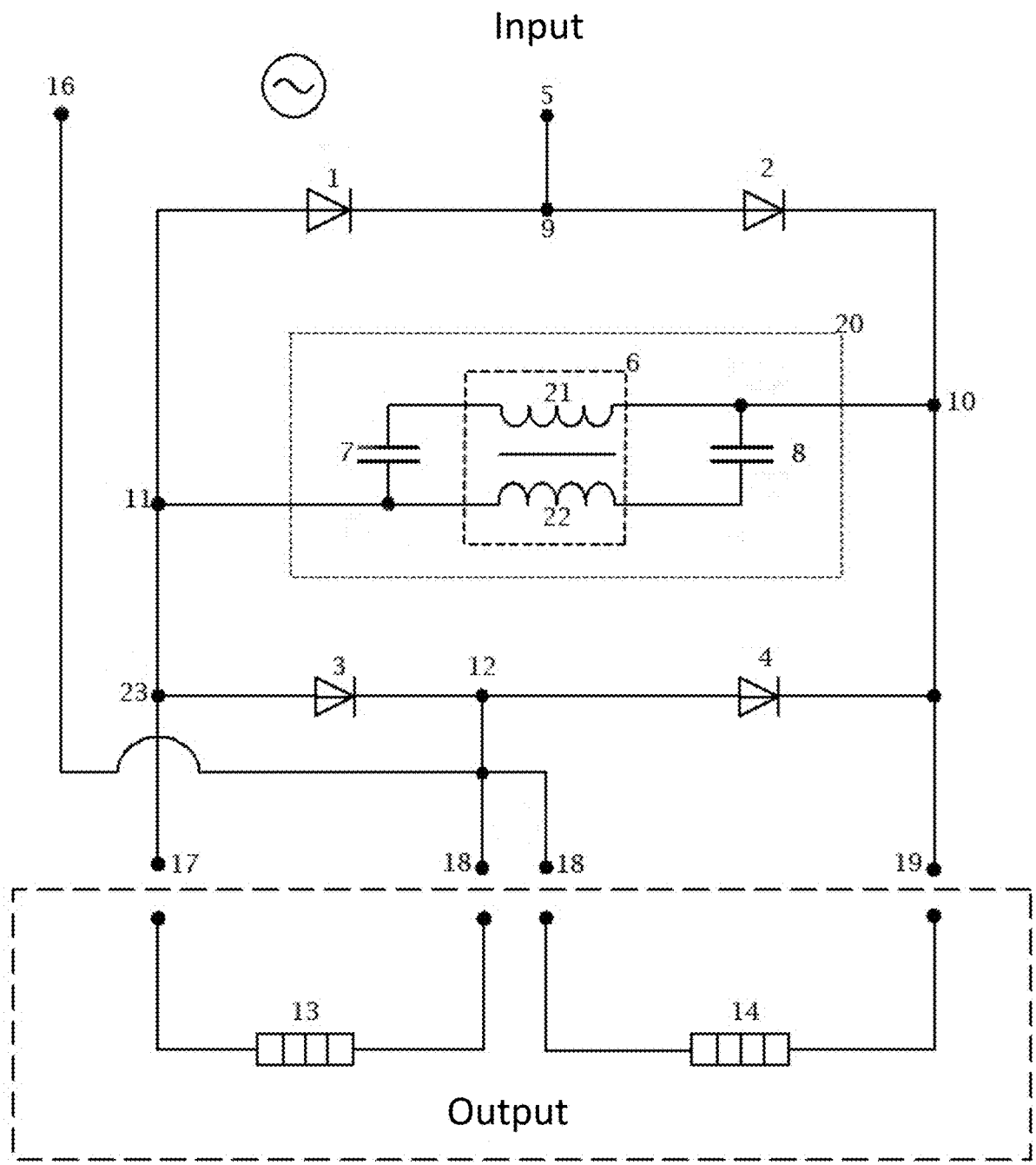
FIG. 2b illustrates a scheme of two-phase connection of a system of converter and CL-LC oscillator connected with a load according to the invention.

FIGS. 2a and 2b illustrate a scheme of connection of a system of converter with CL-LC oscillator coupled with a load according to the invention. The converter embodiment is the same as it is illustrateed in the FIG. 1a and supplemented by loads as follows. The first load 13 is connected to the first output terminal 17 of the converter and to the second output terminal 18 of the converter and the second load 14 is connected to the second output terminal 18 of the converter and to the third output terminal 19 of the converter, wherein resistance of the first load 13 is the same as the resistance of the second load 14 ±20%. In our exemplary embodiment, the loads are represented by a ceramic heating element, on which two identical resistances of 30Ω are arranged. Capacitances of the first capacitor 7 and of the second capacitor 8 are equal to 3π/2 multiple of the inductance of the bifilar coil 6, in this case the inductance of the bifilar coil 6 is 30Ω and capacitance of each capacitor 7 and 8 is 94.2Ω.

Second exemplary embodiment of a system of converter and CL-LC type of oscillator coupled with a load according to the invention is connected in the same manner, as it is in the first embodiment (corresponds to the connection in the FIG. 2). In this embodiment, loads 13 and 14 are also represented by the ceramic heating element, in this case with resistances of 26Ω. Inductance of the bifilar coil 6 is 26Ω and capacitance of each capacitor 7 and 8 is 81.64Ω.

Figure 3:
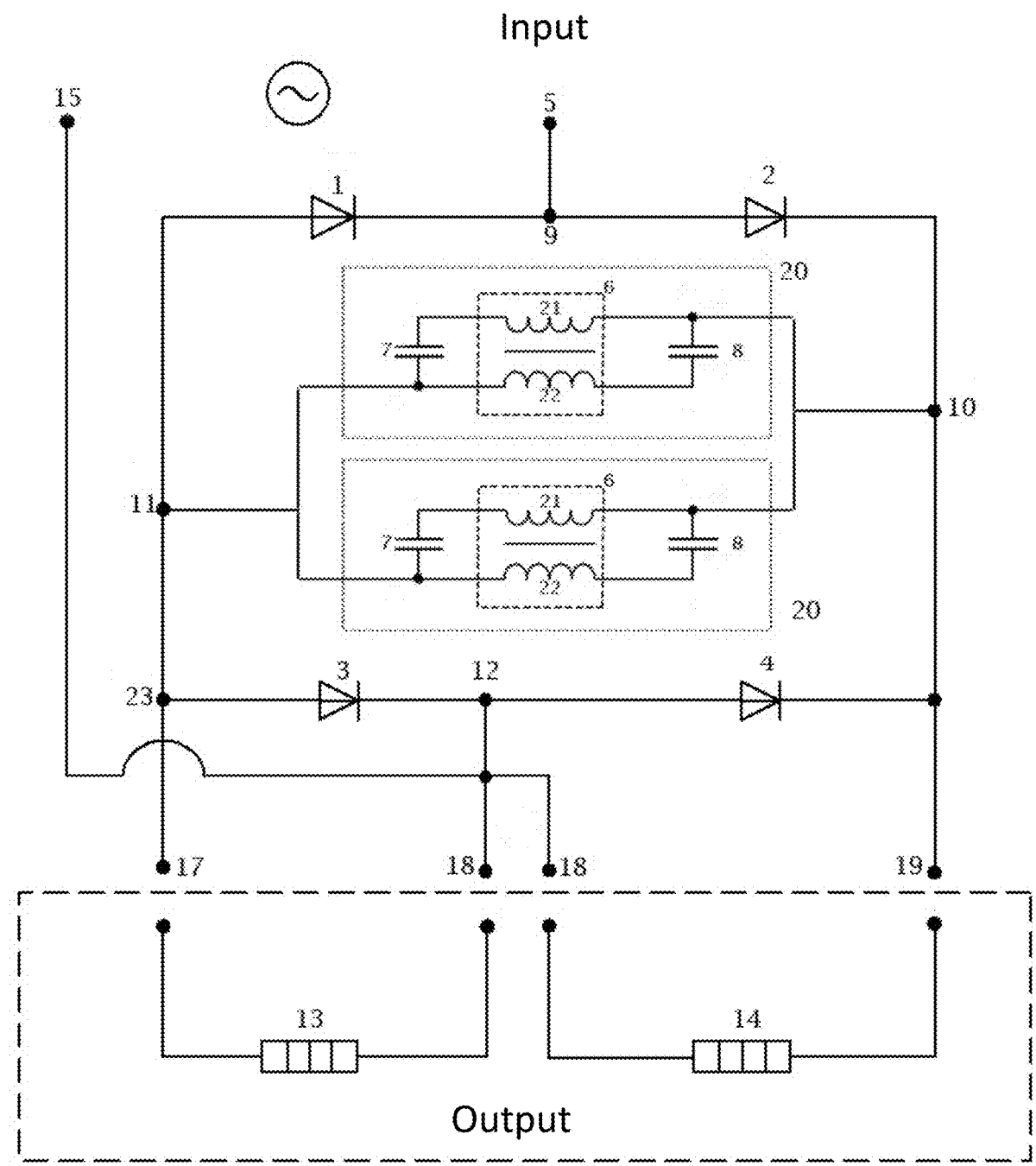
FIG. 3 illustrates a scheme of connection of a system of converter and two CL-LC oscillators with connected with a load according to the invention.

Preferred embodiment of the system of converter coupled with a load according to the invention is illustrated in the FIG. 3. In this case, the converter is provided with two CL-LC oscillator circuits, which was proven to be a preferred variant when we want to connect loads with low resistance and high current load. In this embodiment, two identical and mutually parallel CL-LC oscillator circuits are connected in parallel to the second node 10 and the third node 11.

Figure 4:
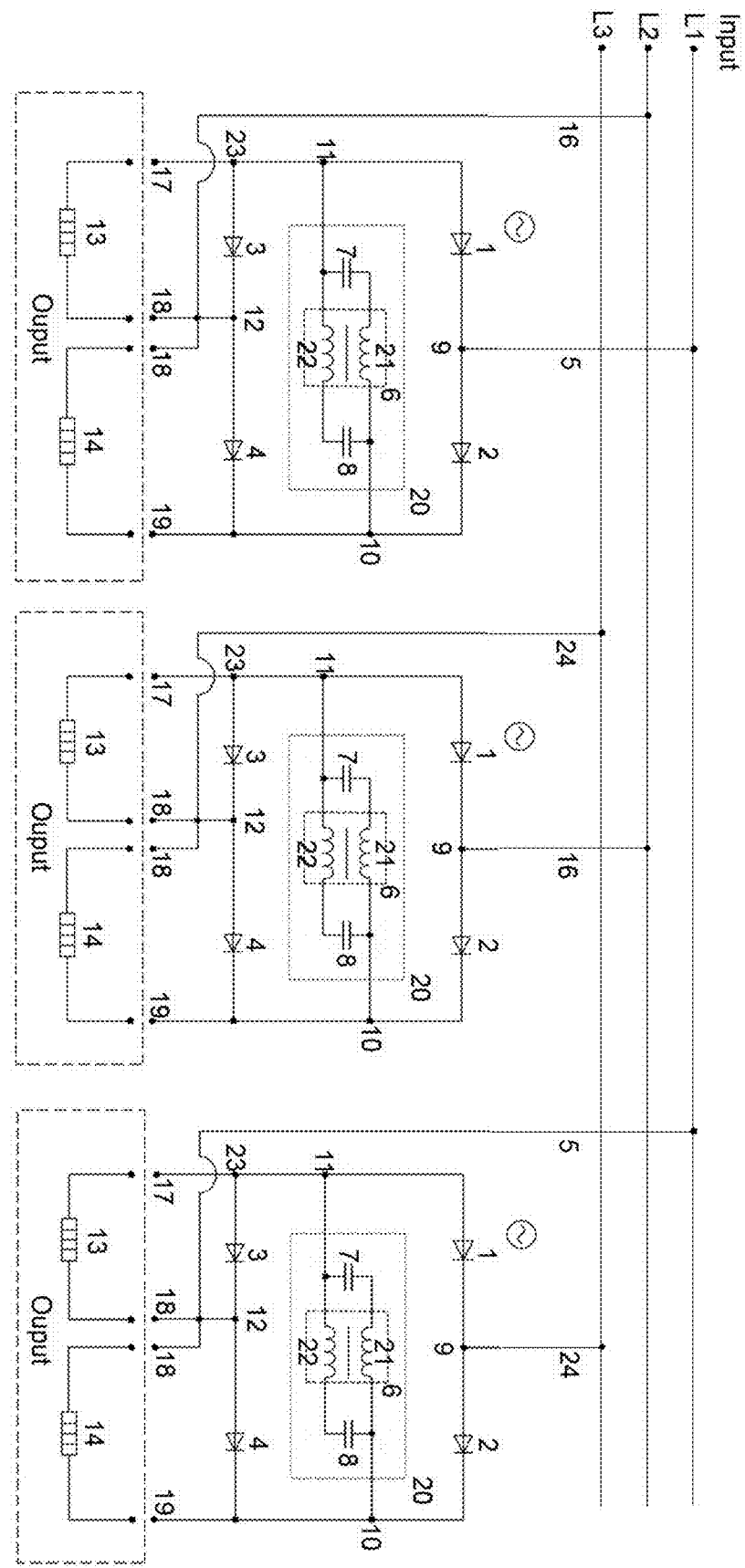
FIG. 4 illustrates a scheme of a three-phase connection with three systems of converter and CL-LC oscillator connected with a load according to the invention.

FIG. 4 illustrates a scheme of a three-phase connection with three systems of converter and oscillator coupled with a load according to the invention. In this case, three converters with CL-LC type of oscillators are used, wherein two loads are connected to each converter. Three converters with oscillator are connected into a cascade, so that the converter 1 is connected between phases L1 and L2, converter 2 is connected between phases L2 and L3 and converter 3 is connected between phases L3 and L1.

Effects of both converter connections according to the invention were tested in several practical applications.

Figure 5:
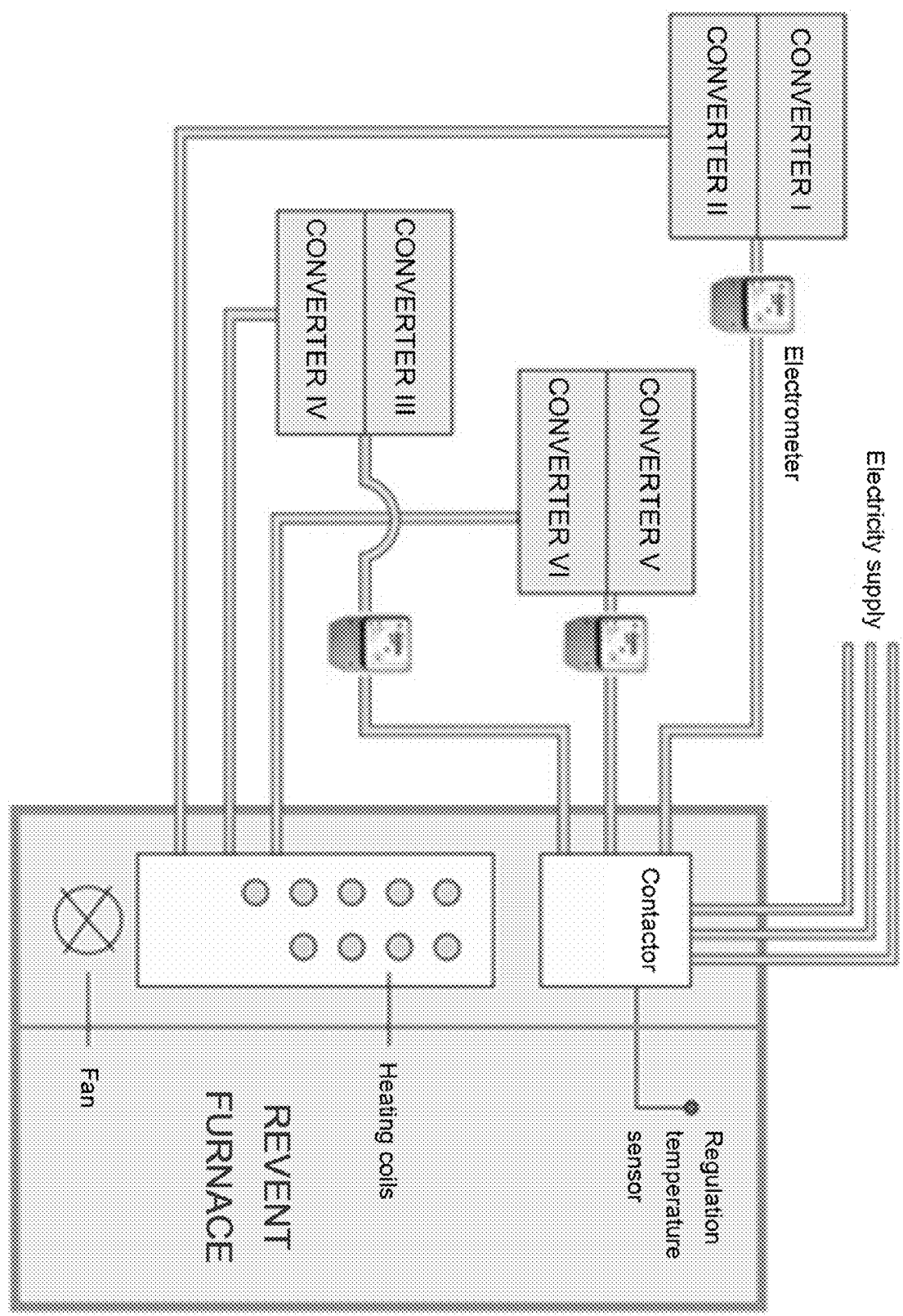
FIG. 5 illustrates an experimental installation of 6 converters with CL-LC oscillator according to the invention in a furnace

FIG. 5 illustrates a block diagram of a three-phase connection in an experimental installation on a furnace. The converter with the oscillator has been experimentally installed in the baking oven Revent in a standard operation. This oven is provided with 27 units standard heating resistance elements Backer S 1136 with resistance of 21Ω. The temperature in the oven which is in a constant three-shift operation, is maintained at 105° C. An empty oven is preheated to 205° C. (mode 1) before putting in a batch of bakery goods, after the goods are put in the oven the heating increases up to the standard baking temperature 280° C. (mode 2). In a standard oven connection, i.e. without using converters, all resistance elements are used for heating. When heating the oven using the converter with the oscillator according to the invention, 6 converters with CL-LC type of converters were connected into a cascade, each provided with the bifilar coil with inductance XL of 21Ω and two capacitors with a capacitance of Xc1 and Xc2=65.9Ω (50 μF) connected as it is illustrated in the FIG. 5. Converters with oscillator were connected to the power supply through their own electrometer and common contactor. The oven was provided with a temperature sensor, which regulated the operation of contactor. After the hot air had been distributed, forced circulation by means of a fan was ensured. Only 12 pieces of heating elements were used for heating (2 resistive heating elements were connected to each converter).

Measurements have been performed repeatedly before the installation of the converter (standard embodiment) and after the installation of 6 converters (connection with converter), always at the same baking mode and the same amount. Acceleration of temperature from 105° C. to 205° C. was measured (mode 1) and then another increase from 217° C. to 280° C. (mode 2). Time and consumption were also measured.

Measurement in the Standard Embodiment, i.e. Converter not Connected:

TABLE 1

| Mode 1 in the standard embodiment: | | |
| --- | --- | --- |
| Time | Temperature ° C. | Consumption kW |
| 7:07 | 105 | |
| 7:14 | 205 | 7.3 |

Overall heating time of an empty furnace from 105° C. to 205° C. in this standard embodiment with 62.5 kWh measured input power was 7 min, wherein the consumption was 7.3 kW.

TABLE 2

| Mode 2 in the standard embodiment: | | |
| --- | --- | --- |
| Time | Temperature ° C. | Consumption kW |
| 7:17 | 217 | |
| 7:26 | 280 | 10.8 |

Overall heating time of furnace with inserted bakery goods from 217° C. to 280° C. in this standard embodiment with 72 kWh measured input power was 9 min, wherein the consumption was 10.8 kW.

Measurement in a Connection with Converter:

TABLE 3

| Mode 1 in a connection with converter: | | |
| --- | --- | --- |
| Time | Temperature ° C. | Consumption kW |
| 8:14 | 105 | |
| 8:22 | 205 | 5.9 |

Overall heating time of the furnace with inserted bakery goods from 105° C. to 205° C. in the embodiment with connected converters with 44.25 kWh of measured input was 8 min, wherein the consumption was 5.9 kW.

TABLE 4

| Mode 2 in a connection with converter: | | |
| --- | --- | --- |
| Time | Temperature ° C. | Consumption kW |
| 8:28 | 217 | |
| 8:39 | 280 | 8.9 |

Overall heating time of furnace with inserted bakery goods from 217° C. to 280° C. in an embodiment with connected converters with 48.54 kWh of measured input power was 11 min, wherein the consumption was 8.9 kW.

In an experimental connection with converter in the mode 1 in contrast to the standard connection 19.7% of energy is saved, wherein the heating time is negligibly extended from 7 min to 8 min. In the mode 2 in contrast to the standard connection 17.9% of energy is saved, wherein the heating time extends from 9 min to 11 min.

The effectivity of industrial applicability of the converter in bakeries' practice was proved by means of this experimental installation.

Another experimental installation (not shown in the drawings), in which the converter was tested, was an installation of the converter in sauna.

Sauna heater SAVO 18 kW was used for the connection, in which 9 pieces of heating elements 2 kW/230V/26Ω were installed. Two converters according to the invention connected into a cascade were used for the connection in sauna. Two elements 2 kW/230V/26Ω were connected to each converter. The converters with oscillators were identical, the capacitance of capacitors was 83Ω (40 μF) and the inductance of coils was 26.5Ω.

In a standard connection, i.e. not connected converters, the measurements had been repeatedly carried out during one week:

The average power consumption during the first run in the given day to heat an empty sauna from 41° C. to 92° C. reached 14 kW. During the operation of already heated sauna (tempering) the average consumption was 69.13 kW per day.

In a connection of converters and heating by means of four resistive heating elements measurements on everyday basis had been carried out throughout one month:

The average consumption in the first run in the given day to heat an empty sauna from 41° C. to 92° C. was 8.91 kW. During the operation of already heated sauna (tempering) the average consumption was 55.215 kW per day.

It means that the amount of energy saved during the operation with converter during the first heating of sauna, which was always carried out under the same conditions, was 36% on average, while the amount of energy saved during custom all-day operation is around 20%.

Control elements (thermostats and time relays) were set identically in both cases. Sauna was still controlled by the same control unit with the same program.

Third experimental installation used for testing the converter according to the invention was an installation of the converter on an air testbed.

Figure 6:
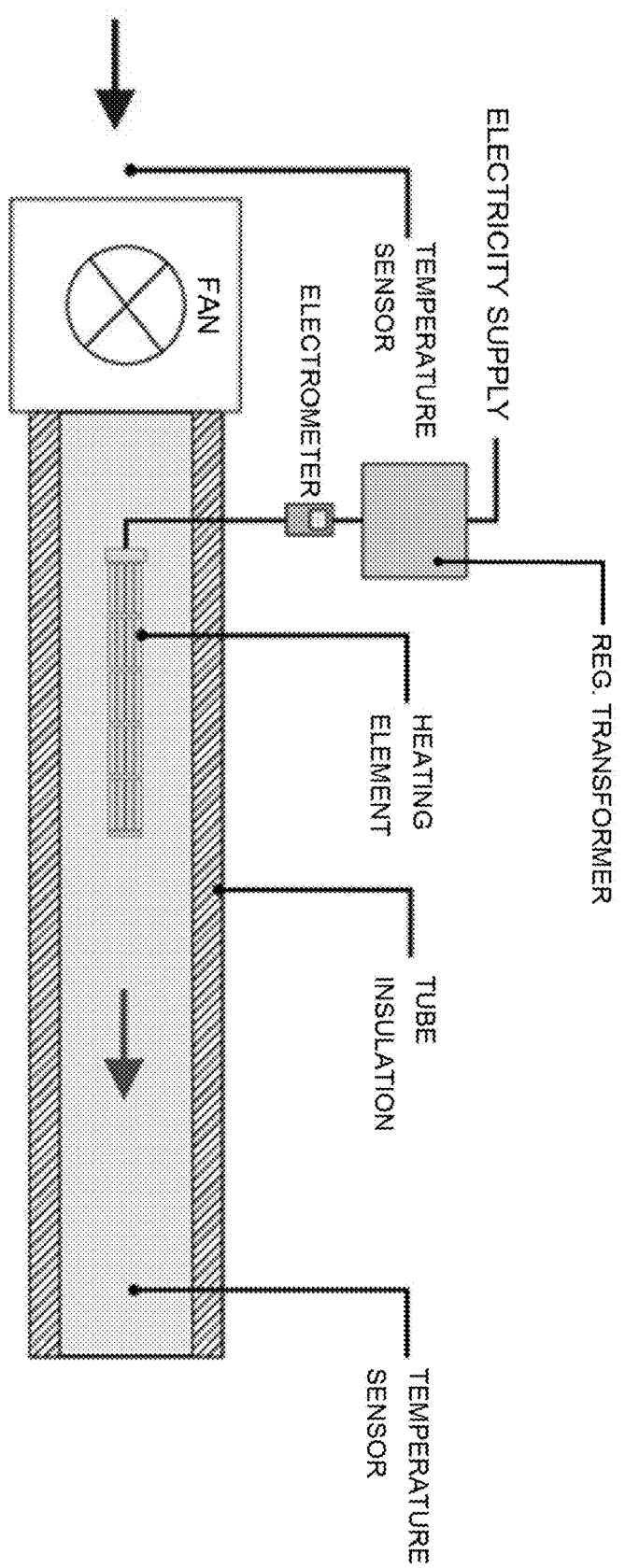
FIG. 6 illustrates a scheme of experimental installation—air test bench in standard connection without converter and the oscillator according to the invention
Figure 7:
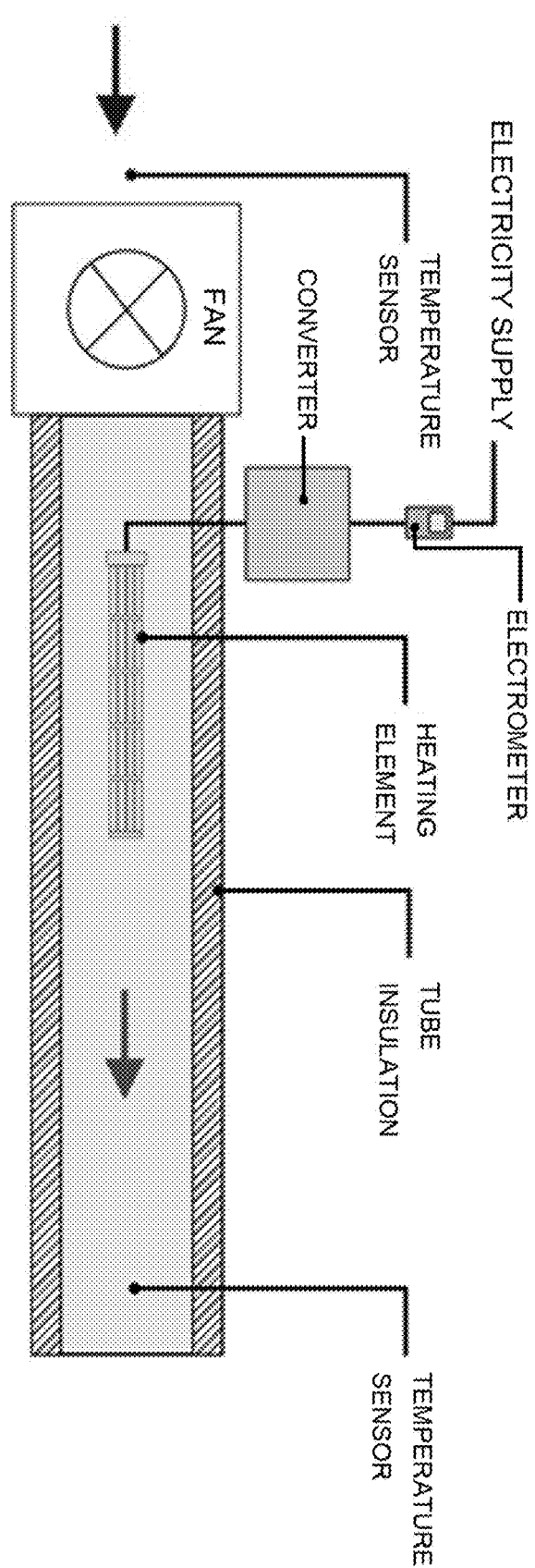
FIG. 7 illustrates a scheme of experimental installation of converter with CL-LC oscillator according to the invention on the input into air test bench.

Comparative measurement of performance of the connected resistive heating element was carried out on an air testbed, once with the converter, see the FIG. 6, and once without the converter, see the FIG. 7. The measurement assembly consists of an 180 cm long tube consisting of two coaxial tubes from zinc, the first one with diameter of 200 mm and the second with diameter of 300 mm, wherein the space between the tubes was filled with thermal insulation, and the tube is further fitted onto a fan with the capacity of 800 m$^3$ of air per 1 hour. Ceramic resistive heating element with the following electrical properties 32Ω/150 V is attached in the tube.

A temperature sensor, which measures the temperature of air at the input, is arranged in front of the fan. Another temperature sensor is attached in the tube in order to measure the temperature at the output. This sensor is approximately 1 meter far from the end of the heating element.

At first, the measurement of an output temperature of air with connected converters, with wattmeter arranged before them, was carried out. During heating in this circuit input power and temperature of air at the input and the temperature of air at the output were measured at first. Input power of 2280 W was read on the wattmeter and the input and output temperature was measured. For the measurement without converter the wattmeter was arranged behind the regulating transformer, on which the same input power as in the first measurement, thus 2280 W, was set. Subsequently, the input and output power was measured. Resistive element was identical in both cases.

Results of the first set of verification measurement on air testbed:

In the first test on the air testbed an identical testing time was set. The measurement results are as follows:
Testing time without converter . . . 2.400 sec.
Testing time with converter . . . 2.400 sec.
Energy consumption without converter . . . 2.320 kW/h
Energy consumption with converter . . . 2.280 kW/h
Reached temperature difference of the input/output air without converter . . . 18.75° C.
Reached temperature difference of input/output air with converter . . . 21.29° C.
Difference of temperatures . . . 2.54° C. i.e. 13.52%

The presented results are the average of 5 measurement cycles. Average changes in temperatures with and without converter are compared.

In the second test on the air testbed, the same target air temperature was determined in both measurements. The results are as follows:

In this measurement, we focused on reached the same temperature by using the converter as well as without it. Average output air temperature of 36.1° C. was determined as a reference temperature.
Initial temperature without converter . . . 15.4° C.
Initial temperature with converter . . . 15.4° C.
Time of reaching 36° C. without converter . . . 954 sec.
Time of reaching 36° C. with converter . . . 668 sec.
Energy consumption without converter . . . 614.8 W/h
Energy consumption with converter . . . 423.1 W/h
Saved power . . . 31.19%

The same input power of 2280 kW was used in both cases, therefore it may be concluded that 31.19% less energy is consumed in order to achieve the same output temperature.

3. Steady Mode
Testing time without converter . . . 900 sec.
Testing time with converter . . . 900 sec.
Consumed energy without converter . . . 580 W/h
Consumed energy with converter . . . 570 W/h
Reached input/output temperature difference without converter . . . 21.26° C.
Reached input/output temperature difference with converter . . . 24.14° C.
Temperature difference . . . 2.89° C. tj. 15.40%

Figure 8:
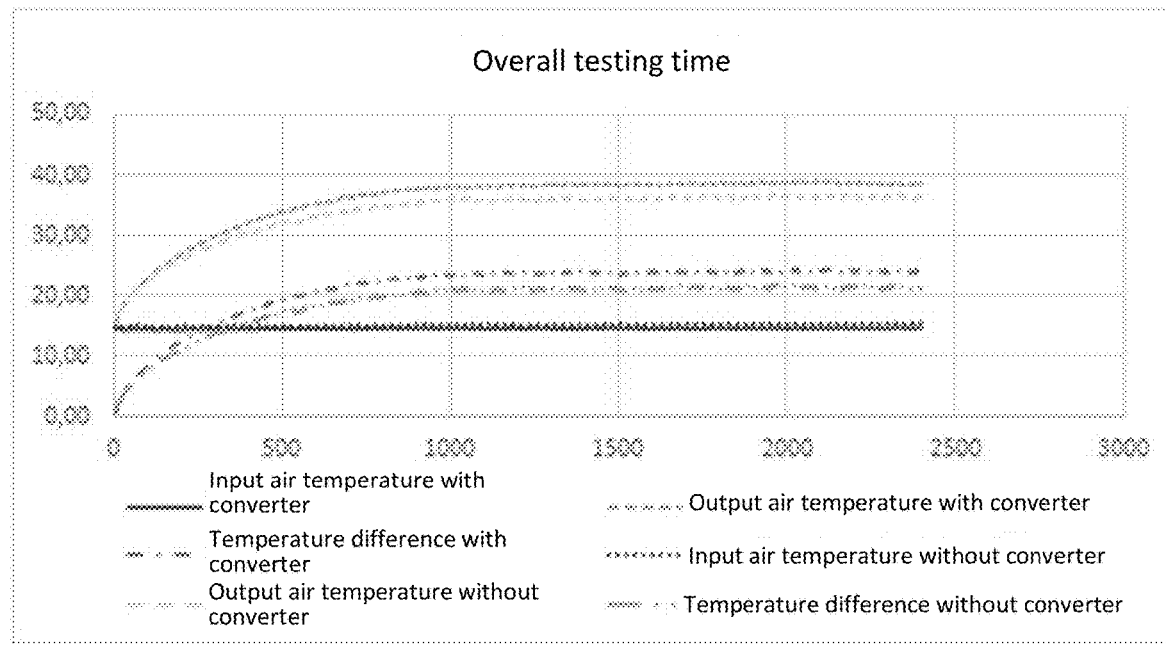
FIG. 8 illustrates a diagram of the progress of temperatures measured in air test bench with converter as well as without converter.
Figure 9:
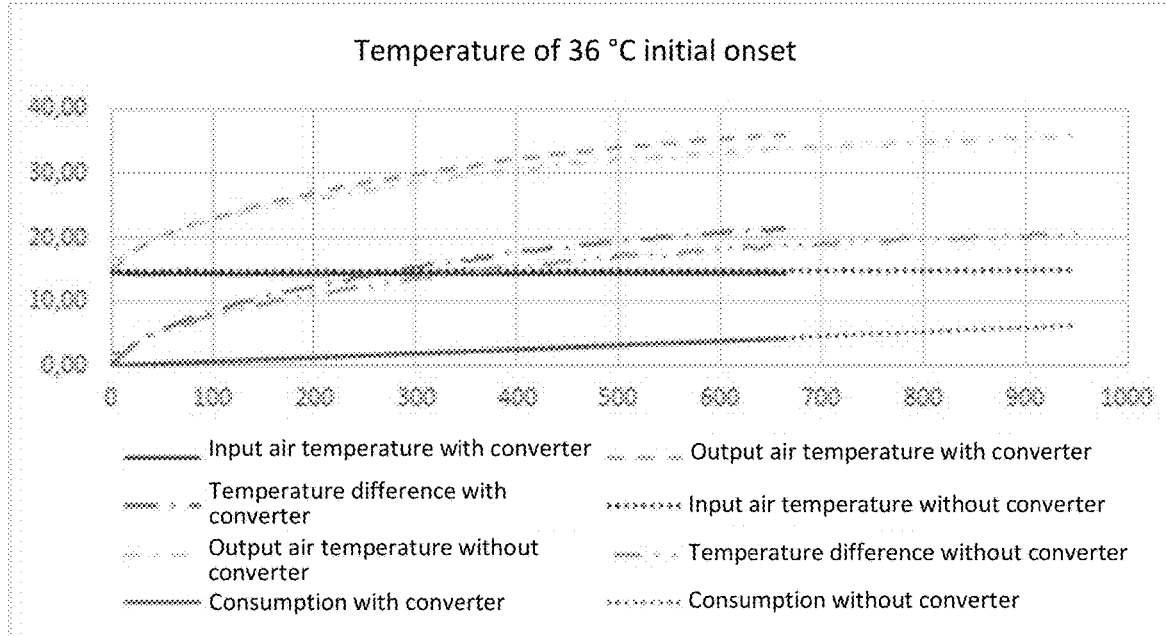
FIG. 9 illustrates a diagram of temperature acceleration measured in air test bench with converter as well as without converter
Figure 10:
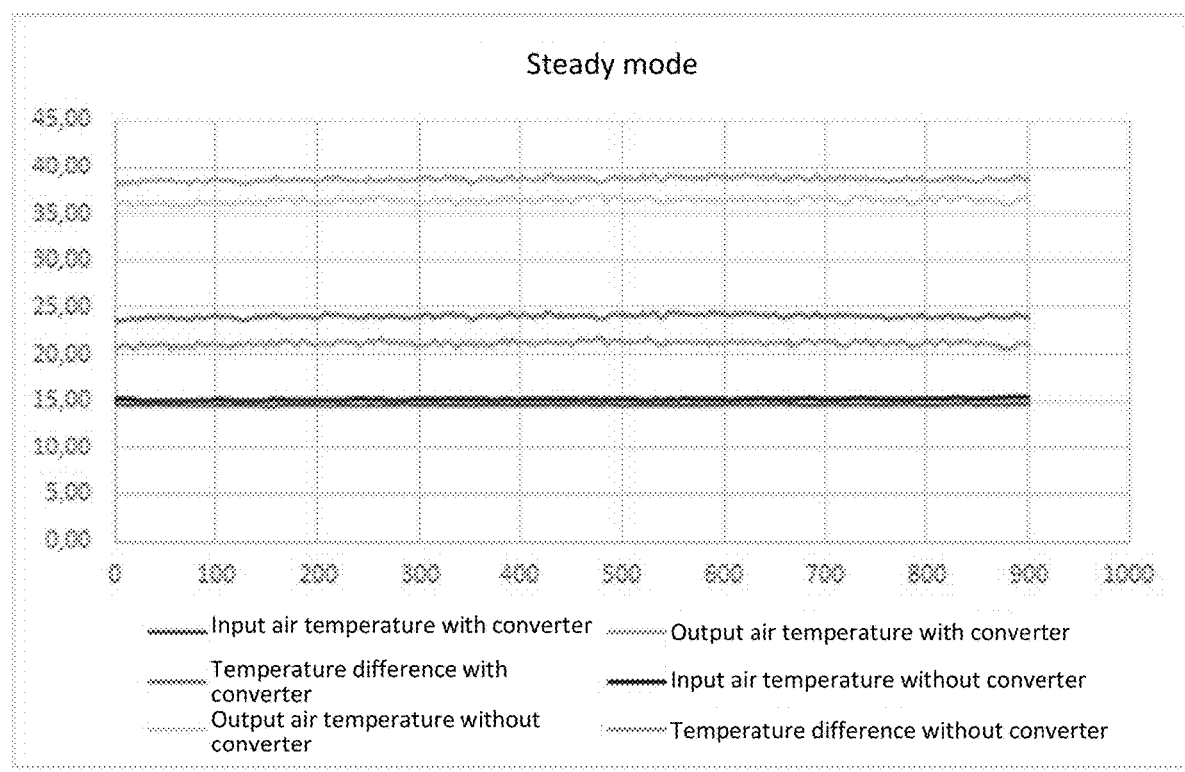
FIG. 10 illustrates a diagram of measured achieved temperature values in air test bench with converter in steady mode.

Results in the table represent an average of 5 measurement cycles. It is apparent, that higher output temperatures are reached with the same input power, approximately 15%. It is necessary to note that 10 W/h less energy was consumed with the converter. The results are more clearly shown in the diagrams in the FIGS. 8, 9 and 10.

Figure 11:
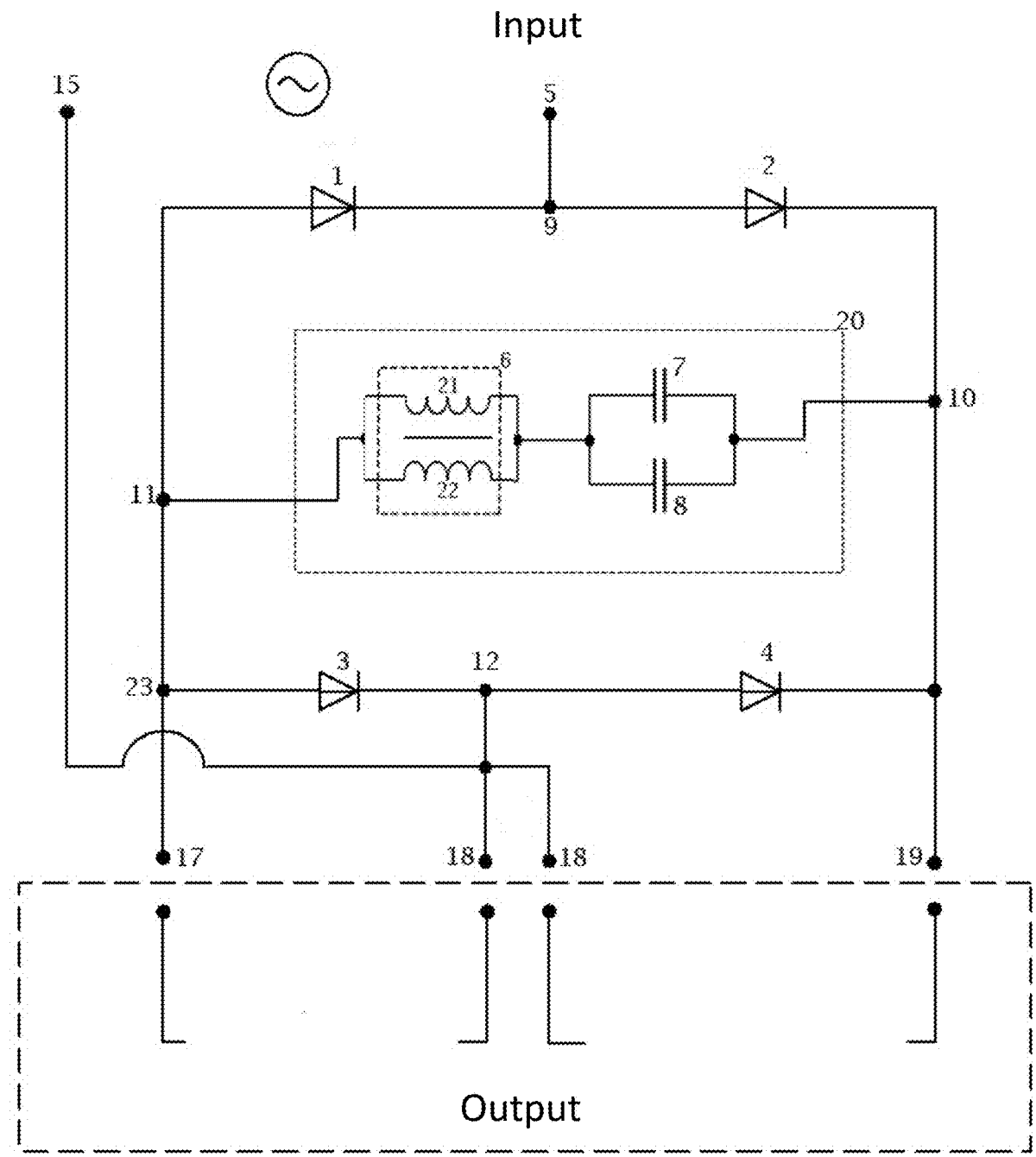
FIG. 11 illustrates a scheme of connection of converter with LC oscillator according to the invention.

FIG. 11 illustrates a scheme of exemplary connection of converter and LC oscillator in this case, according to the invention. Converters with oscillators are connected on the first phase input terminal 5 of the converter for phase connection in parallel through the first node 9 to the cathode of the first diode 1 as well as to the anode of the second diode 2, where the first diode 1 has the anode connected through the third node 11 to the anode of the third diode 3 as well as to the first output terminal 17 of the converter, wherein cathode of the third diode 3 is connected through the fourth node 12 to the anode of the fourth diode 4 as well as to the neutral conductor 15 (FIG. 1a) or to the second phase input terminal 16 (not shown) of the converter and also to the second output terminal 18 of the converter, wherein the fourth diode 4 has the cathode connected to the third output terminal 19 of the converter and through the second node 10 to the cathode of the second diode 2, which results in a standard connection of Graetz bridge. One oscillator circuit 20 comprising the bifilar coil 6 with the first winding 21 and the second winding 22 and two capacitors, is connected between the second node 10 and the third node 11. In this case, the oscillator circuit 20 is connected so that first end of the first winding 21 of the bifilar coil 6 and of the first end of the second winding 22 of the bifilar coil 6 are directly connected to the third node 11 and the other ends of the first winding 21 of the bifilar coil 6 and the second winding 22 of the bifilar coil are connected through at least one capacitor to the second node 10.

Figure 12:
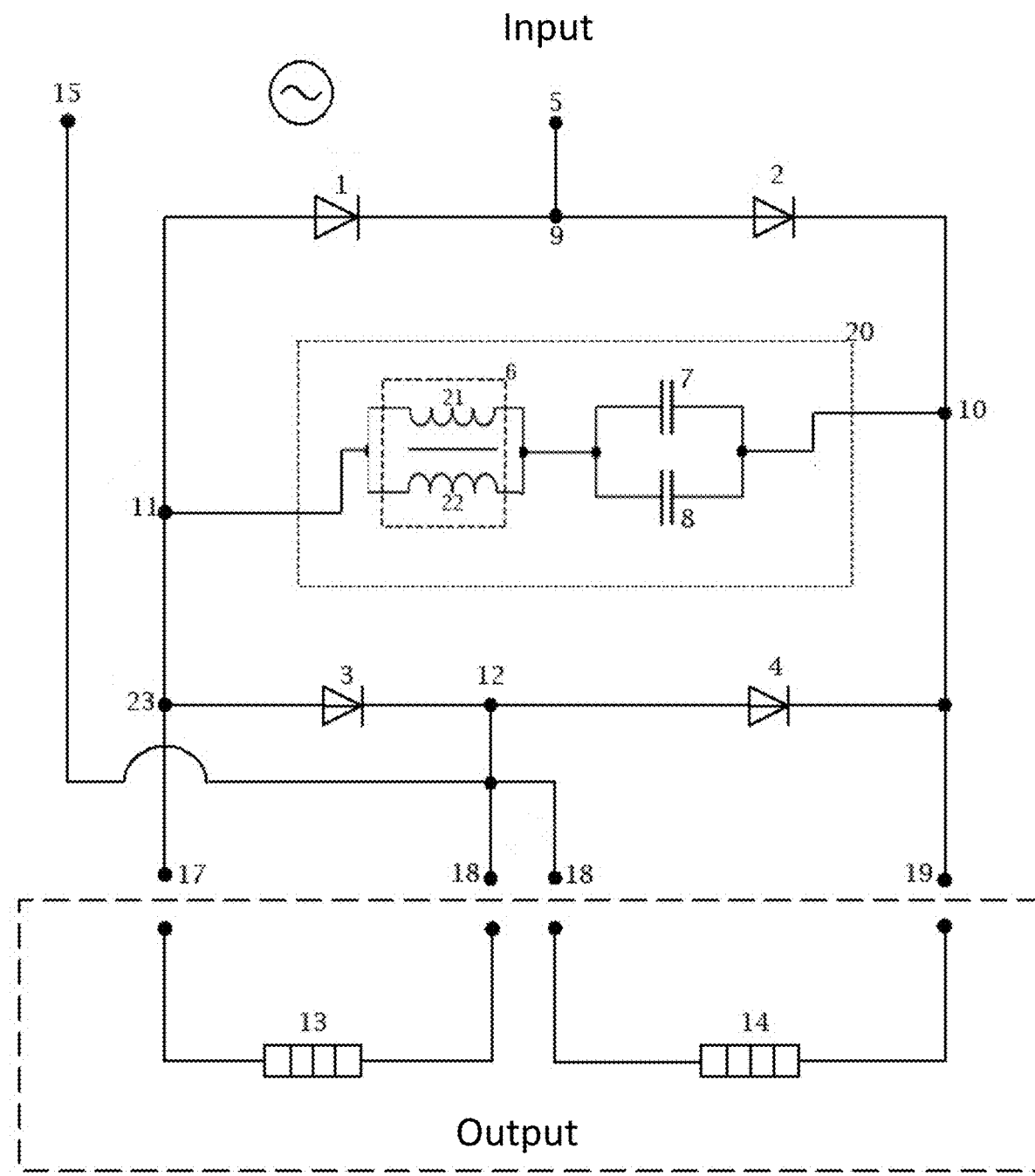
FIG. 12 illustrates a scheme of connection of system of converter and LC oscillator with a load according to the invention.

FIG. 12 illustrates a scheme of connection of a system of the converter and the oscillator coupled with a load according to the invention, wherein a converter illustrated in the FIG. 11 is used.

Figure 13:
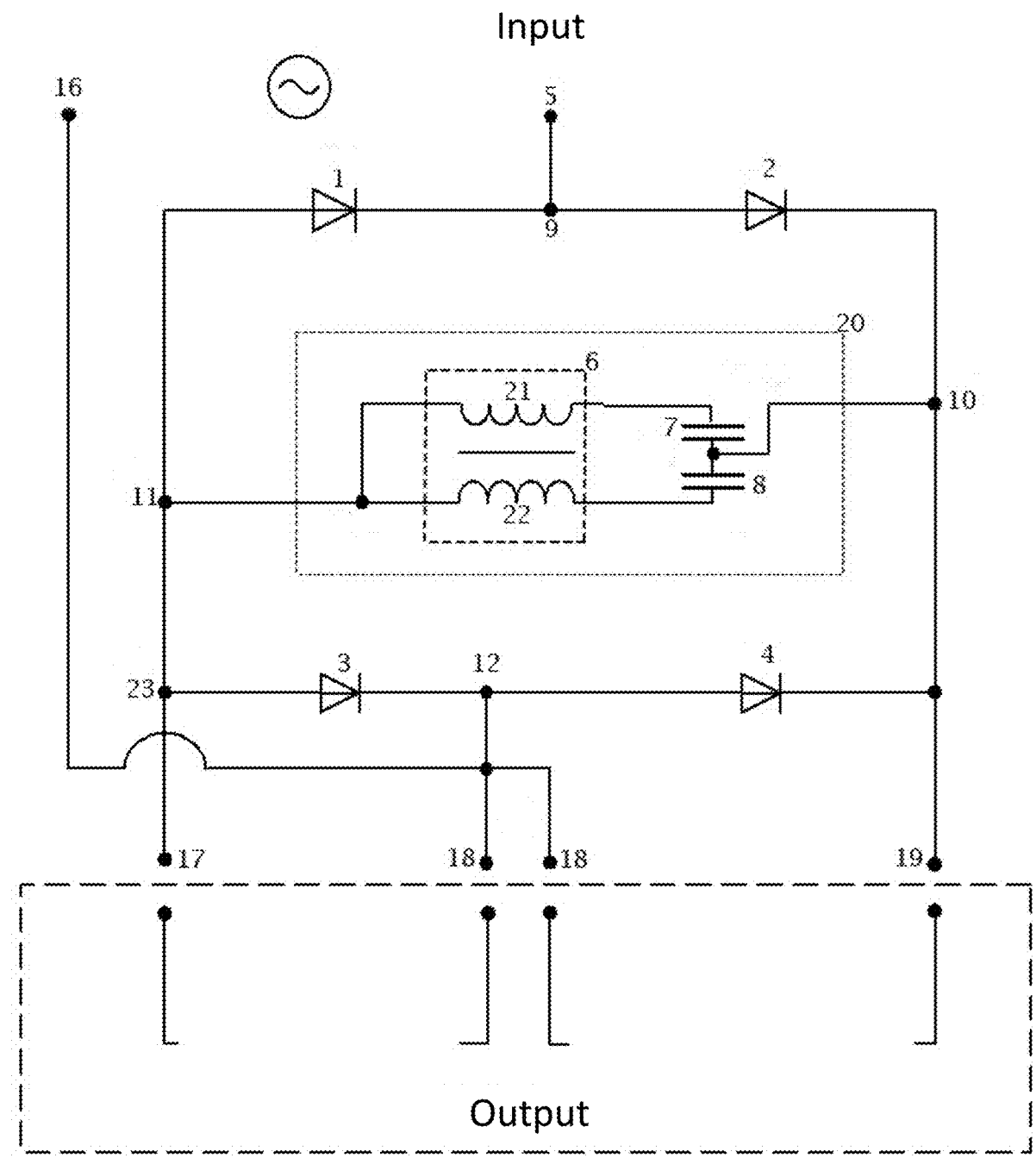
FIG. 13 illustrates a scheme of connection of converter and LC-LC oscillator according to the invention.

FIG. 13 illustrates a scheme of connection of converter and LC-LC oscillator according to the invention. In this case, the oscillator circuit is designed so that the first ends of the first winding 21 of the bifilar coil 6 and of the second winding 22 of the bifilar coil 6 are connected in direct manner to the third node 11 and the other end of the first winding 21 of the bifilar coil 6 is connected via the first capacitor 7 and the other end of the second winding 22 of the bifilar coil 6 is connected via the second capacitor 8 to the second node 10.

Figure 14:
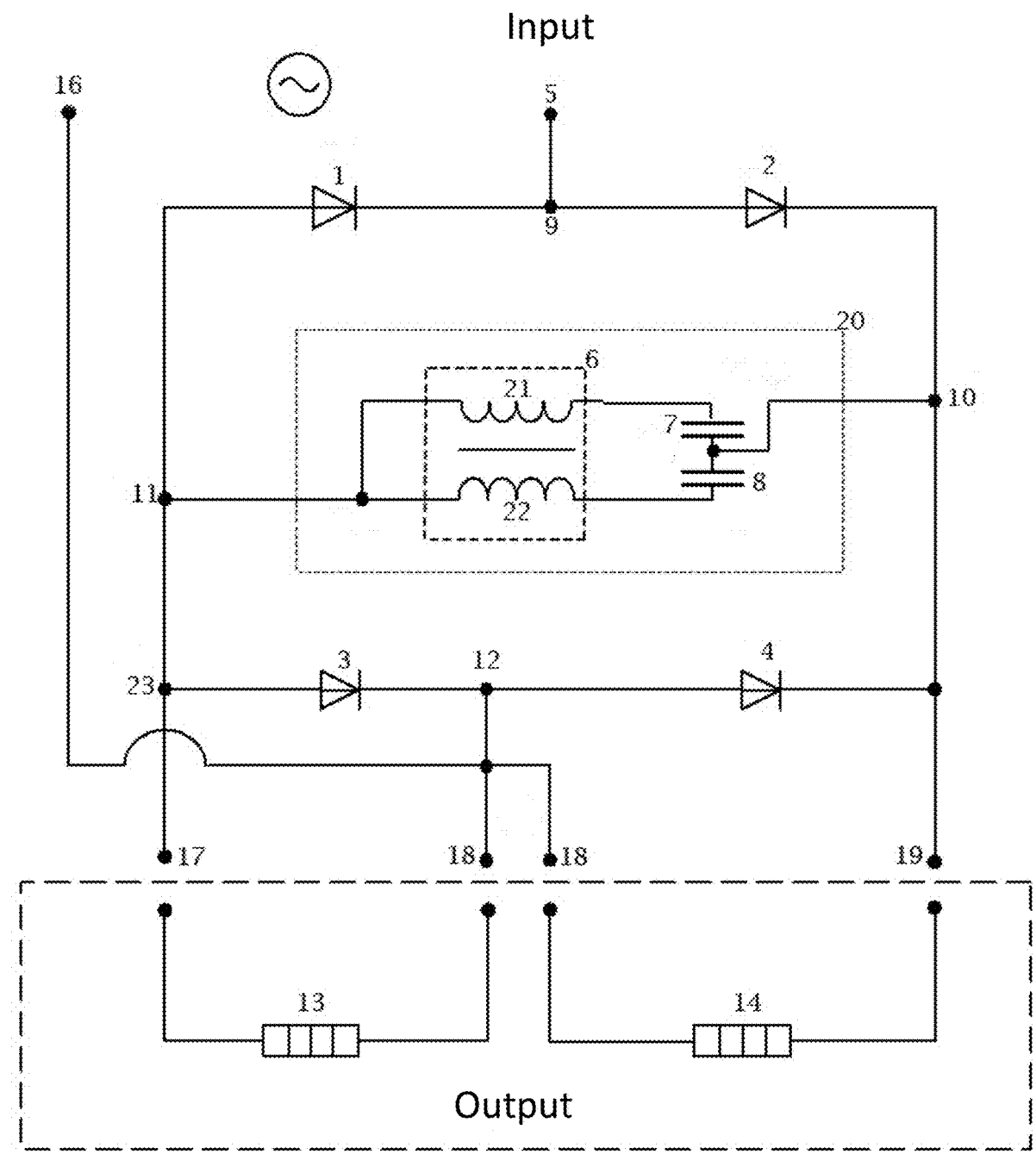
FIG. 14 illustrates a scheme of connection of a system of converter with LC-LC oscillator connected with a load according to the invention.

FIG. 14 illustrates a scheme of connection of a system of converter and oscillator coupled with a load according to the invention, wherein a converter illustrated in the FIG. 13 is used.

To get an idea about behaviour of the system of the converter with the oscillator coupled with a load according to the invention, the systems were illustrated in the FIG. 2a (CL-LC type of circuit), FIG. 12 (LC type) and FIG. 14 (LC-LC type) provided with a RIGOL type of digital oscilloscope. Converters with oscillators provided with the bifilar coil with the inductance of 42Ω and capacitors with the capacitance of 66Ω (50 μF) were coupled with a load represented by ceramic, air heating element, produced by BECKER ELTOP s.r.o. company for voltage of 240V, which consists of two resistance, each of 42Ω, 1350 Watts. Same flows of voltage and current were measured during measurements of all three systems.

Figure 15:
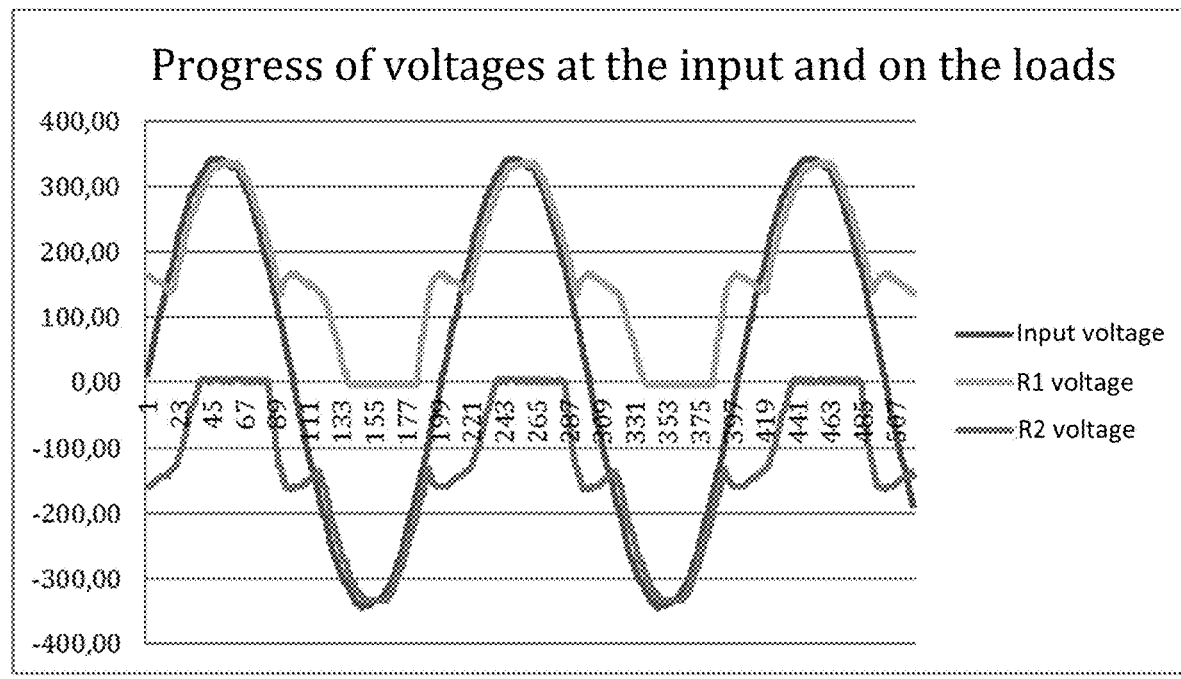
Figure 16:
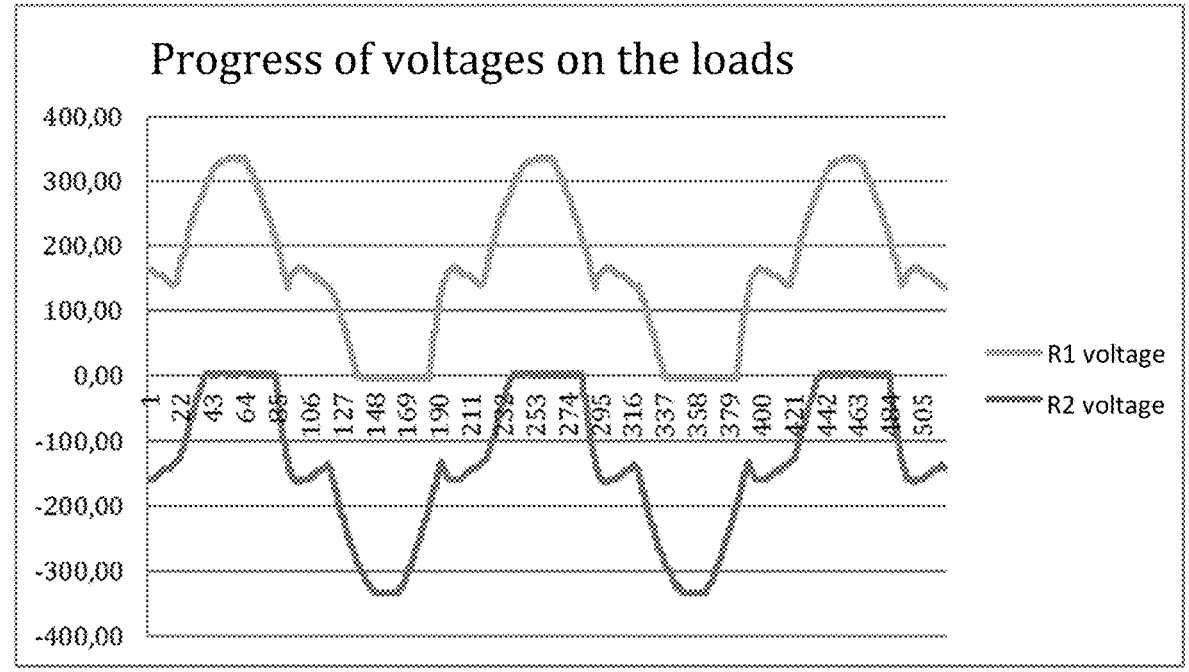

FIG. 15 shows a diagram of measured progress of voltage at the input and on the loads. The diagram shows a progress of voltage at the output of the converter with oscillator, which is a typical sine wave, where the line begins on zero. On the loads, the effect caused by properties of the converter with oscillator is added to the sine wave. For better orientation, only progress of voltages on both loads are shown in the FIG. 16. It is apparent that at the output the duration of the action of voltage on particular loads is extended, and it is also certain that the area enclosed by the function in the progress of the output voltage from the converter with the oscillator is bigger. The mean value of the voltage on loads is thus higher than the mean value of the input voltage. It is also important to note that overlapping of the actions of particular impulses occurs on the both loads, which are, however, divided at the input by means of rectifier.

In numerical terms, this means:
The area enclosed by a function of input voltage is: 111.384
The area enclosed by a function of output voltages: 155.624
Numerical difference (absolute): 44.240
Percentual difference: 39.7%

Figure 17:
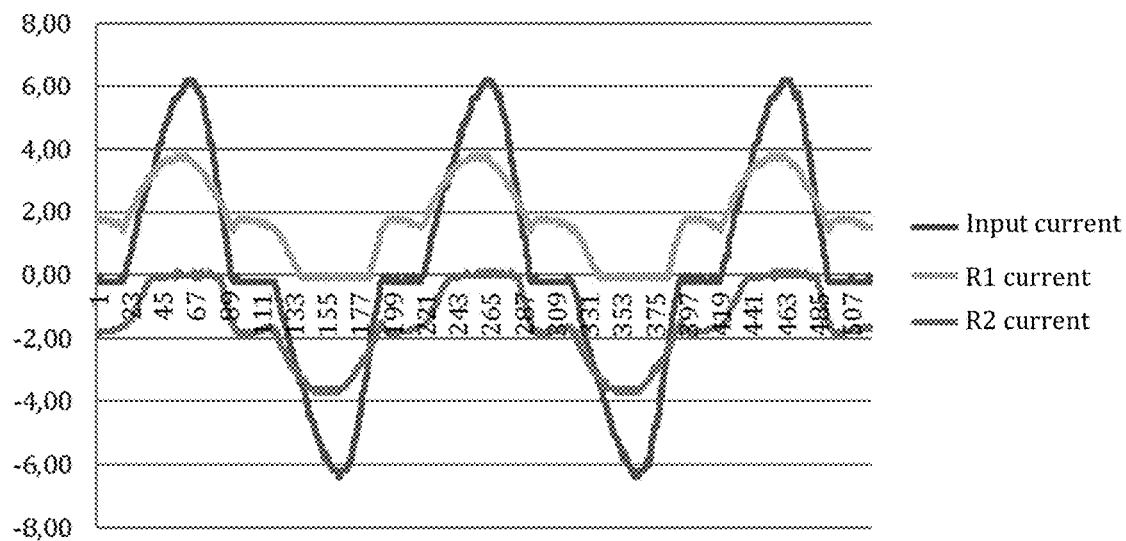
Figure 18:
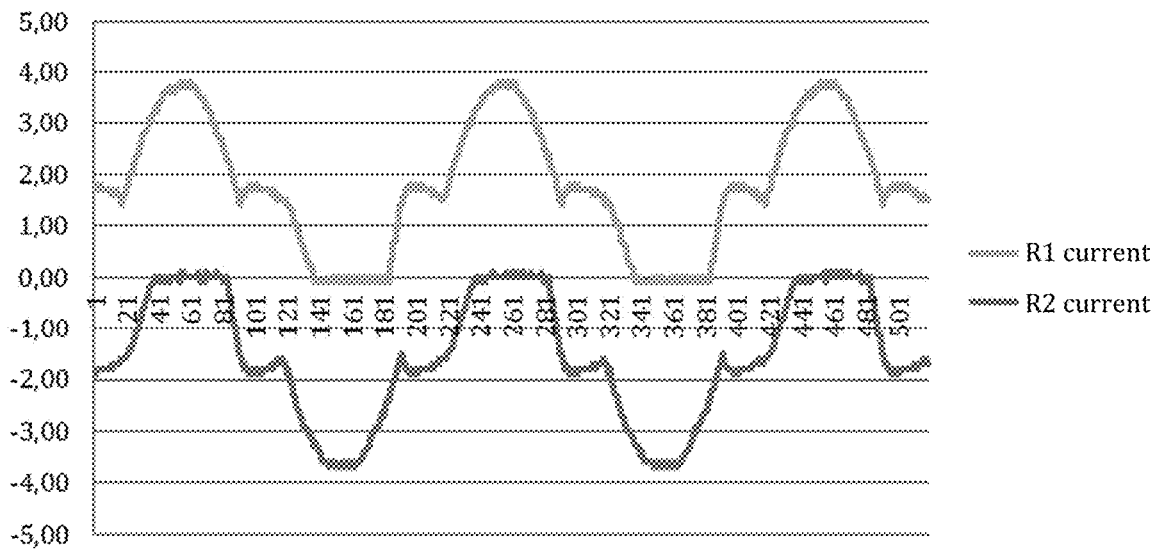

FIG. 17 shows a diagram illustrating the measured waveform of the current at the input and on the loads. The diagram shows the progress of the current at the input of the converter and voltages on both loads. It is apparent that the flow time of currents on the voltages at the outputs is also extended. There is also an overlap of durations of action at the output of time-separated impulses. In case of currents, the area enclosed by a function of the progress of input current from the converter with the oscillator is also bigger. For better orientation, the diagram in the FIG. 18 shows the progress of current only on the both loads.

In numerical terms, this means:
Area enclosed by a function of the input current is: 1.381.6
Area enclosed by a function of the output current is: 1.744.2
Numerical difference (absolute): 362.60
Percentual difference: 26.24%

Figure 19:
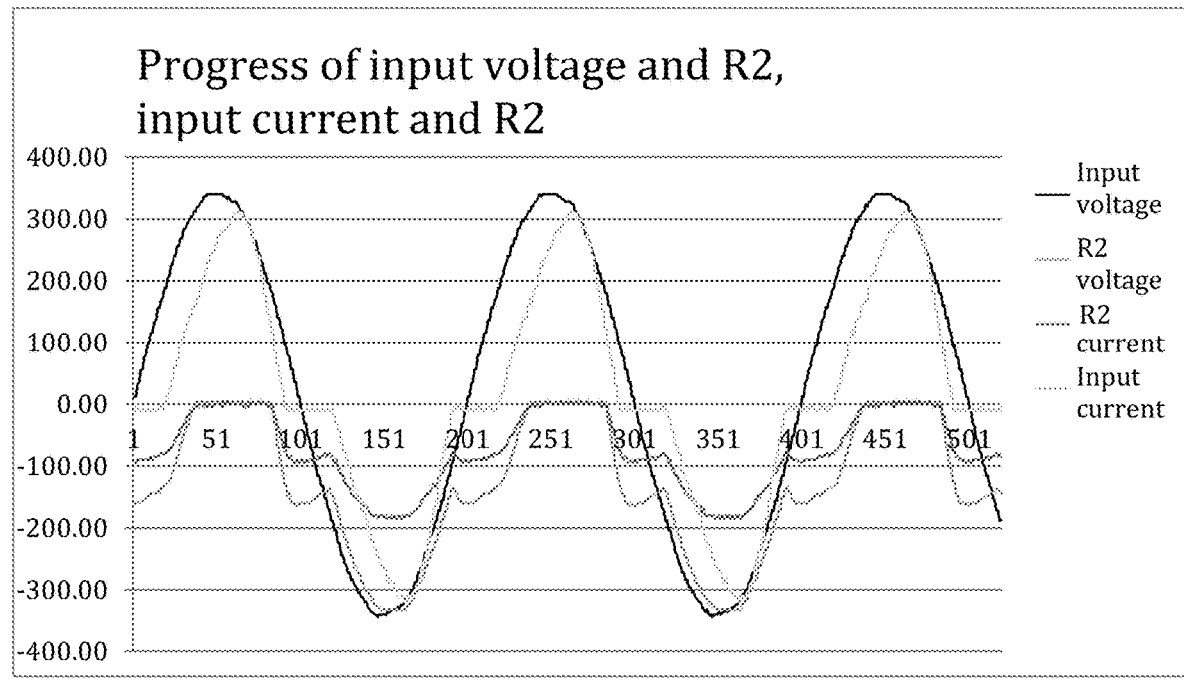
FIG. 19 illustrates a diagram of progress of measured voltages and current on the input and voltages and current on the R2 load in the connection according to the FIG. 2a, 230V/50 Hz as standard.
Figure 20:
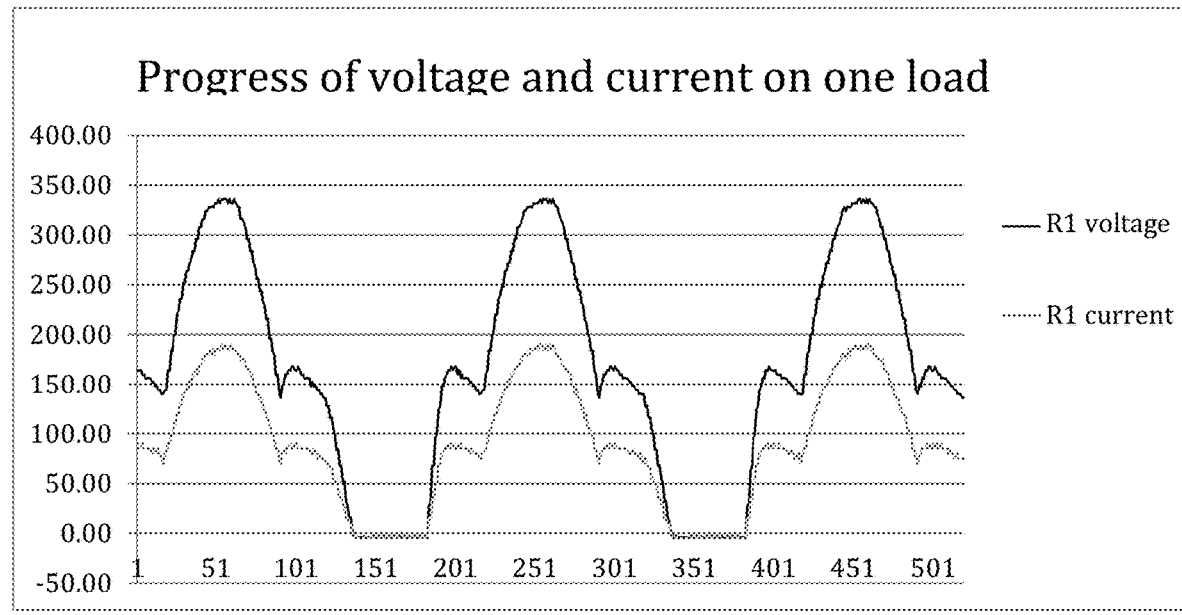
FIG. 20 illustrates a diagram of progress of measured voltages and current values on the R2 load in the connection according to the FIG. 2a, 230V/50 Hz as standard.

Another important finding results from the diagram of current and voltage progress at the input of the converter with the oscillator as well as voltage and current at the output, which is illustrated in the FIG. 19. For easier orientation, only one load is shown and the current is increased 50 times, wherein a separate diagram of voltage and current on the load is in the FIG. 20 (current is again increased 50 times). It is apparent that the phase shift of the current and voltage at the input is negligible, the current and voltage are back in the phase on the loads. Therefore it may be concluded that the LC-CL circuit operates in a preferred mode and the loads are strictly active. In practice, any phase shift means decrease of converter power.

Figure 21:
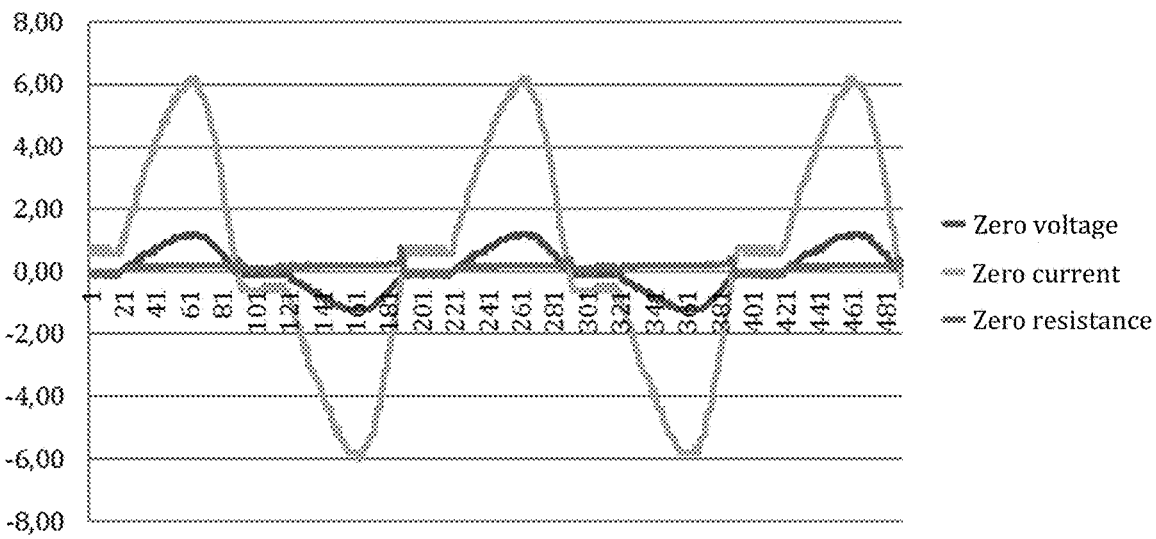

The diagram in the FIG. 21 shows progress of voltage, current and resistance on the neutral conductor in the connection according to the FIG. 2a.

Figure 22:
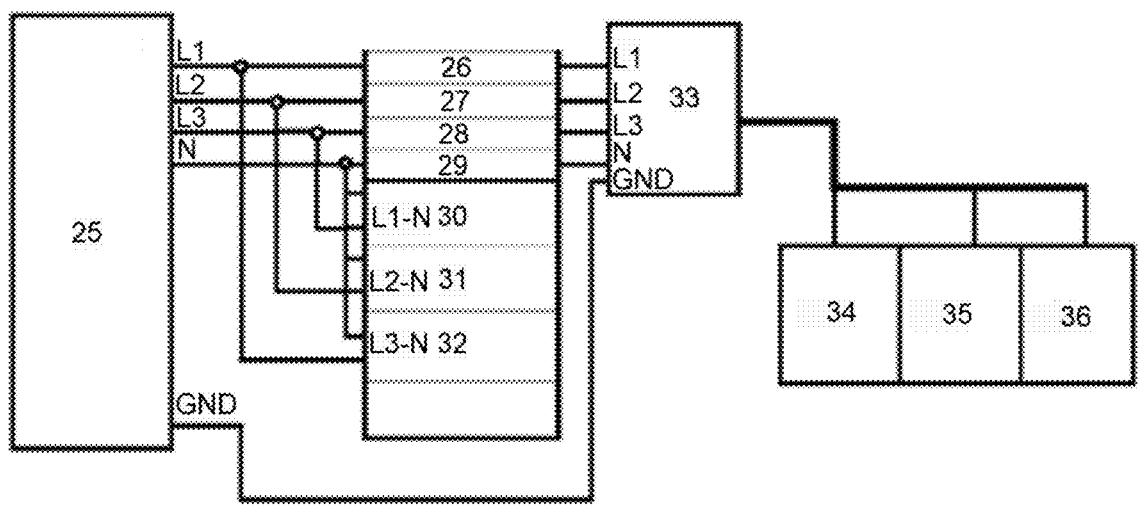
FIG. 22 illustrates a test block scheme of the connection of a system of converter and oscillator with three-phase power distributor connected with a load.

FIG. 22 illustrates a test block scheme of a three-phase connection with a system of converters with oscillators coupled with a load, which were in this particular test case represented by three three-phase heater 34, 35 and 36. In testing the function of the converter according to the invention, the input power into three-phase heaters in two configurations was measured (alternating component of the current, direct component of the current, maximum current value, the peak-to-peak current, alternating component of the voltage, direct component of the voltage, active power, reactive power, power factor and frequency). The first configuration is a direct connection of the heater into a three-phase network and the second configuration is an arrangement of the system of converters with oscillators between the three-phase network and heaters. At the same time, the temperature at the inputs and outputs of heaters 34, 35 and 36 in six points was measured, wherein T-type thermocouples were used for this measurement, which were connected to a data-logger. Three thermocouples were arranged each one separately on the output side of each heater 34, 35 and 36 and thus measured the air temperature at the input. Another three thermocouples were arranged on the output side of the heaters 34, 35 and 36 in the same manner and thus measured the temperature of the output air. The embodiment of the thermocouples allowed a quick response, the thermocouple junction was designed shell-less. Recording interval of thermocouples was one second.

Three-channel analyser was used for measuring the input power (current and voltage), where one channel served for measuring one phase. Data were measured for ten minutes with recording of two values per minute. Test measurement was carried out by professional specialists in instruments linked to standards in accredited laboratories.

TABLE 5

Power input measurements during testing of the functionality of the invention

| Measured quantities | connections | |
|---|---|---|
| | Without connection of system of converters and oscillators | With connection of system of converters and oscillators |
| Phase 1 current (A) | 22.4 | 25.1 |
| Phase 2 current (A) | 22 | 24.2 |
| Phase 3 current (A) | 21.8 | 25.4 |
| Voltage P1-N (V) | 236.39 | 236.74 |
| Voltage P2-N (V) | 235.6 | 236.32 |
| Voltage P3-N (V) | 234.8 | 234.68 |
| Phase 1 power factor (—) | 0.99 | 0.967 |
| Phase 2 power factor (—) | 0.99 | 0.973 |
| Phase 3 power factor (—) | 0.99 | 0.973 |
| Total active power (W) | 15600 | 17129 |

TABLE 6

Temperature without system of converters and oscillators

| Time (min) | Average output temperatures | Average output temperatures | Temperature difference |
|---|---|---|---|
| 0:00:00 | 30.38 | 29.35 | 1.03 |
| 0:01:00 | 50.59 | 29.63 | 20.96 |
| 0:02:00 | 70.65 | 30.05 | 40.60 |
| 0:03:00 | 82.41 | 30.54 | 51.87 |
| 0:04:00 | 89.10 | 30.66 | 58.44 |
| 0:05:00 | 92.64 | 30.97 | 61.67 |
| 0:06:00 | 94.44 | 31.07 | 63.37 |
| 0:07:00 | 96.38 | 31.30 | 65.08 |
| 0:08:00 | 97.43 | 31.61 | 65.82 |
| 0:09:00 | 97.48 | 31.53 | 65.95 |
| 0:09:55 | 98.08 | 31.88 | 66.20 |

TABLE 7

Temperature with system of converters and oscillators

| Time (min) | Average output temperatures | Average output temperatures | Temperature difference |
|---|---|---|---|
| 0:00:00 | 30.53 | 29.53 | 1.00 |
| 0:01:00 | 54.73 | 30.05 | 24.68 |
| 0:02:00 | 81.11 | 30.57 | 50.54 |
| 0:03:00 | 97.18 | 31.50 | 65.68 |
| 0:04:00 | 103.92 | 31.56 | 72.36 |
| 0:05:00 | 107.83 | 31.96 | 75.87 |
| 0:06:00 | 108.94 | 32.01 | 76.93 |
| 0:07:00 | 110.32 | 31.89 | 78.43 |
| 0:08:00 | 110.11 | 32.17 | 77.93 |
| 0:09:00 | 110.59 | 32.21 | 78.38 |
| 0:09:55 | 110.74 | 32.34 | 78.40 |

Figure 23:
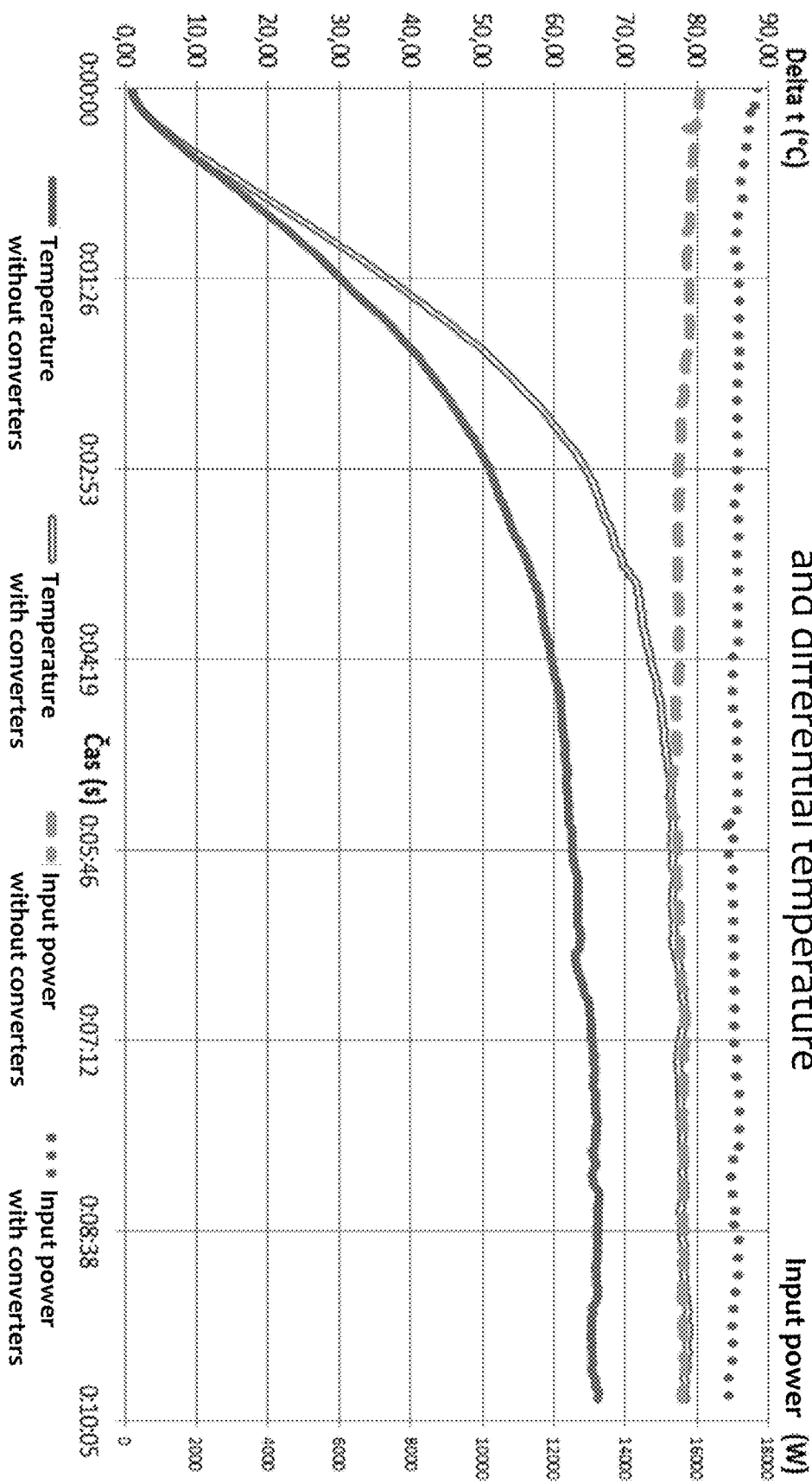
FIG. 23 illustrates a diagram of testing measured progresses of temperature dependence and input power dependence on time according to the FIG. 22.

FIG. 23 shows a diagram of measured test progress of differential temperature measured on thermocouples arranged on the output side and corresponding power input with time according to the FIG. 22.

During this measurement we focused on achieving the same input power in measurements of both configurations. As it is shown in the tab. 5, the achieved value of overall input power in the second system configuration with connected converters was only 9.8% higher than in the first system configuration without connecting the converters and the power factor is within the norm established limits.

Nevertheless, from the values in tab. 6 and tab. 7 results a higher temperature gradient achieved in the second system configuration with converters with the above mentioned input power. The measurement was performed in a closed room for 9 minutes and 55 seconds. At first, the measurement in the first system configuration without converters was carried out. Input temperature was measured by means of 3 thermocouples and averaged, wherein at the beginning of the measurement the average of all input temperature values was 29.35° C. and at the end it was 31.88° C., which was caused by the heating of the surroundings in a closed room in general. The output temperature was measured again by means of 3 thermocouples and then averaged, wherein at the beginning of measurement the average of output temperature values reached 30.38° C. and at the end it was 98.08° C. The overall difference between input temperatures and output temperatures at the beginning of measurement was 1.03° C. and at the end of measurement it was 66.20° C.

Subsequently, the measurement in the second system configuration with connected converters was carried out. At the beginning of measurement the average of input temperature values reached 29.53° C. and at the end it was 32.34° C., which was again caused by the overall heating of surroundings in a closed room. The average of input temperatures reached 30.53° C. and at the end it was 110.74° C. The overall difference between input temperatures and output temperatures at the beginning of measurement was 1.00° C. and at the end it was 78.40° C.

It apparently results from what is stated above that the overall reached temperature difference in the measurements at the input and the output reaches 18.4% higher temperature in the connection with converters than in the connection without converters. In the connection without converters the maximum reached temperature difference at the input and at the output is around 66° C., wherein the value of 66° C. is achieved for the first time after 7 minutes and 46 second, while in the connection with converters the maximum reached temperature difference in the measurement at the input and at the output is around 78° C., wherein the difference value of 66° C. is reached after 3 minutes and 4 seconds. Energy consumption in order to achieve the same temperature of 66° C. in this test in a connection without converters is 2003 W/h and in the connection with converters it is 864 W/h. In reaching this temperature in 59% of time and achieving energy saving of 57%.

TECHNICAL APPLICABILITY

The converter with the oscillator and a system of the converter and the oscillator coupled with a load according to the invention are intended to increase efficiency of electric devices.

LIST OF REFERENCE NUMBERS 1. first diode
2. second diode
3. third diode
4. fourth diode
5. first phase input terminal of the converter
6. bifilar coil
7. first capacitor 8. second capacitor
9. first node
10. second node
11. third node
12. fourth node
13. first load
14. second load
15. neutral conductor
16. second phase input terminal of the converter
17. first output terminal of the converter
18. second output terminal of the converter
19. third output terminal of the converter
20. oscillator circuit
21. first winding
22. second winding
23. fifth node
24. third phase
25. switchgear
26. current channel 1
27. current channel 2
28. current channel 3
29. current channel 4
30. voltage channel 1
31. voltage channel 2
32. voltage channel 3
33. system of converters and oscillators
34. heater 1
35. heater 2
36. heater 3

The invention claimed is:

1. A converter with an oscillator connected to an AC voltage supply via a first phase input terminal and a neutral conductor or a second phase input terminal comprises: the first phase input terminal of the converter for connecting the phase through a first node to a cathode of a first diode as well as to an anode of a second diode, where the first diode has an anode connected through a third node to an anode of a third diode as well as to a first output terminal of the converter, wherein a cathode of the third diode is connected through a fourth node to an anode of a fourth diode as well as to the neutral conductor or to the second phase input terminal of the converter as well as to a second output terminal of the converter, wherein the fourth diode has a cathode connected to a third output terminal of the converter and through a second node to a cathode of the second diode, wherein between the second node and the third node one or more mutually parallelized oscillator circuits comprising a bifilar coil with a first winding and a second winding, and at least one capacitor, are connected; wherein
the oscillator circuit is connected so that the first winding of the bifilar coil through the first capacitor and the first end of the second winding of the bifilar coil are connected to the third node, while the other end of the first winding of the bifilar coil and the other end of the second winding of the bifilar coil through the second capacitor are connected to the second node.

2. A converter with an oscillator connected to an AC voltage supply via a first phase input terminal and a neutral conductor or a second phase input terminal comprises the first phase input terminal of the converter for connecting the phase through a first node to a cathode of a first diode as well as to an anode of a second diode, where the first diode has an anode connected through a third node to an anode of a third diode as well as to a first output terminal of the converter, wherein a cathode of the third diode is connected through a fourth node to an anode of a fourth diode as well as to the neutral conductor or to the second phase input terminal of the converter as well as to a second output terminal of the converter, wherein the fourth diode has a cathode connected to a third output terminal of the converter and through a second node to a cathode of the second diode, wherein between the second node and the third node one or more mutually parallelized oscillator circuits comprising a bifilar coil with a first winding and a second winding, and at least one capacitor, are connected; wherein
the oscillator circuit is connected so that the first ends of the first winding of the bifilar coil and of the second winding of the bifilar coil are directly connected to the third node and the other ends of the first winding of the bifilar coil and of the second winding of the bifilar coil are connected through at least one capacitor to the second node.

3. A converter with an oscillator connected to an AC voltage supply via a first phase input terminal and a neutral conductor or a second phase input terminal comprises the first phase input terminal of the converter for connecting the phase through a first node to a cathode of a first diode as well as to an anode of a second diode, where the first diode has an anode connected through a third node to an anode of a third diode as well as to a first output terminal of the converter, wherein a cathode of the third diode is connected through a fourth node to an anode of a fourth diode as well as to the neutral conductor or to the second phase input terminal of the converter as well as to a second output terminal of the converter, wherein the fourth diode has a cathode connected to a third output terminal of the converter and through a second node to a cathode of the second diode, wherein between the second node and the third node one or more mutually parallelized oscillator circuits comprising a bifilar coil with a first winding and a second winding, and at least a first and second capacitor, are connected; wherein
the oscillator circuit is connected so that the first ends of the first winding of the bifilar coil and of the second winding of the bifilar coil are directly connected to the third node and the other end of the first winding of the bifilar coil is through the first capacitor and the other end of the second winding of the bifilar coil is through the second capacitor connected to the second node.

4. The converter with the oscillator according to claim 1, 2 or 3 wherein the capacitance of capacitors in particular branches of the oscillator circuit equals to entire $\pi/2$ multiples of inductance XL of the bifilar coil comprising the first winding and the second winding ±20%.

5. The converter with the oscillator according to claim 1, 2 or 3 wherein the overall capacitance XC of capacitors connected in the oscillator circuit equals to entire $\pi/2$ multiples of inductance XL of the bifilar coil comprising the first winding and the second winding ±20%.

6. The converter with the oscillator according to claim 1 wherein the capacitance of the first capacitor equals to capacitance of the second capacitor and it further equals to entire $\pi/2$ multiples of inductance XL of the bifilar coil comprising the first winding and the second winding.

7. The converter with the oscillator according to claim 5 wherein the overall capacitance XC of capacitors connected in the oscillator circuit equals to entire $\pi/2$ multiples of inductance XL of the bifilar coil comprising the first winding and the second winding.

8. The converter with the oscillator according to claim 1, 2 or 3 wherein two mutually parallelized oscillator circuits are connected in between the second node and the third node.

9. A system comprising converter with oscillator according to claim 1, 2 or 3 wherein a first load is connected to the first output terminal of the converter and to the second output terminal of the converter, and a second load is connected to the second output terminal of the converter and to the third output terminal of the converter, wherein resistance of the first load equals to resistance of the second load ±20%.

10. The system according to claim 9 wherein the resistance of the first load equals to resistance of the second load.

11. The system according to claim 9 wherein the resistance of the loads are equal to the inductance XL of the bifilar coil ±20%.

12. The system according to claim 9 wherein the resistance of the loads ranges between 12Ω and 150Ω.

13. The system according to claim 9 wherein the number of turns in each winding of the bifilar coil ranges between 50 and 6000 turns.

14. A three-phase system wherein it consists of three systems according to claim 9 connected in a cascade so that the first converter with oscillator is connected between the first phase input terminal of the converter and the second phase input terminal of the converter, the second converter with oscillator is connected between the second phase input terminal of the converter and the third phase terminal of the converter and the third converter with oscillator is connected between the third phase input terminal of the converter and the first phase input terminal of the converter.

15. The converter with the oscillator according to claim 3 wherein the capacitance of the first capacitor equals to capacitance of the second capacitor and it further equals to entire π/2 multiples of inductance XL of the bifilar coil comprising the first winding and the second winding.

* * * * *